US006656748B2

(12) United States Patent
Hall et al.

(10) Patent No.: US 6,656,748 B2
(45) Date of Patent: Dec. 2, 2003

(54) FERAM CAPACITOR POST STACK ETCH CLEAN/REPAIR

(75) Inventors: Lindsey H. Hall, Plano, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/125,662

(22) Filed: Apr. 18, 2002

(65) Prior Publication Data

US 2003/0143800 A1 Jul. 31, 2003

Related U.S. Application Data

(60) Provisional application No. 60/353,692, filed on Jan. 31, 2002.

(51) Int. Cl.$^7$ ............................................. H01L 21/00
(52) U.S. Cl. ................................ 438/3; 438/4; 438/240
(58) Field of Search ............................... 438/3, 4, 240, 438/250, 253, 254, 255, 393, 396, 397, 398, 689, 785, 795; 257/303, 310

(56) References Cited

U.S. PATENT DOCUMENTS

| | | | | |
|---|---|---|---|---|
| 6,096,592 | A | * | 8/2000 | Cho ........................... 438/238 |
| 6,472,229 | B1 | * | 10/2002 | Aoki et al. ..................... 438/3 |
| 2003/0001189 | A1 | * | 1/2003 | Fujiwara et al. ............. 257/303 |
| 2003/0030084 | A1 | * | 2/2003 | Moise et al. ................. 257/295 |
| 2003/0067027 | A1 | * | 4/2003 | Fox et al. .................... 257/303 |

OTHER PUBLICATIONS

"Characterization and elimination of dry etching damaged layer in PT/Pb $(Zr_{0.53}Ti_{0.47})O_3$/Pt ferroelectric capacitor", June Key Lee and Seshu B. Desu. Applied Physics Letters, 1999 American Institute of Physics, vol. 75, No. 3, Jul. 19, 1999.
Improvement in the electrical properties in Pt/Pb $(Zr_{0.53}Ti_{0.48})O_3$/Pt ferroelectric capacitors using a set cleaning method, June Key Lee, Sang Deong Oh, Dong Jin Jung, Yoon Jong Song, Bon Jae Koo, Sung Yung Lee and Seshu B. Desu, Journal of Applied Physics, 1999 American Institute of Physics, vol. 86, No. 11, Dec. 1, 1999.

\* cited by examiner

Primary Examiner—Tuan H. Nguyen
(74) Attorney, Agent, or Firm—Jacqueline J. Garner; W. James Brady, III; Frederick J. Telecky, Jr.

(57) ABSTRACT

The present invention is directed to a method of forming an FeRAM integrated circuit, which includes performing a capacitor stack etch to define the FeRAM capacitor. The method comprises etching a PZT ferroelectric layer with a high temperature $BCl_3$ etch which provides substantial selectivity with respect to the hard mask. Alternatively, the PZT ferroelectric layer is etch using a low temperature fluorine component etch chemistry such as $CHF_3$ to provide a non-vertical PZT sidewall profile. Such a profile prevents conductive material associated with a subsequent bottom electrode layer etch from depositing on the PZT sidewall, thereby preventing leakage or a "shorting out" of the resulting FeRAM capacitor.

14 Claims, 16 Drawing Sheets

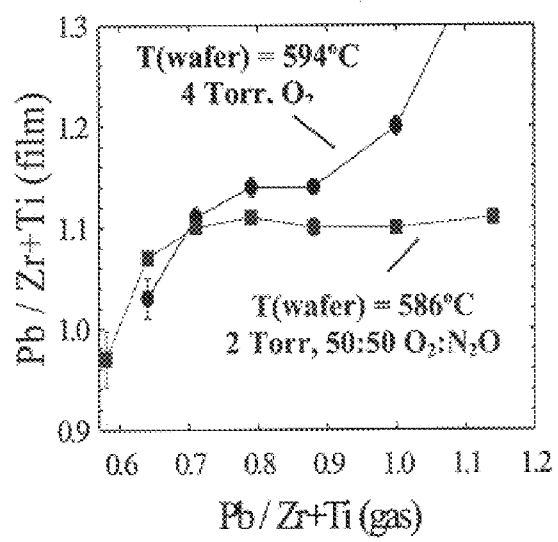 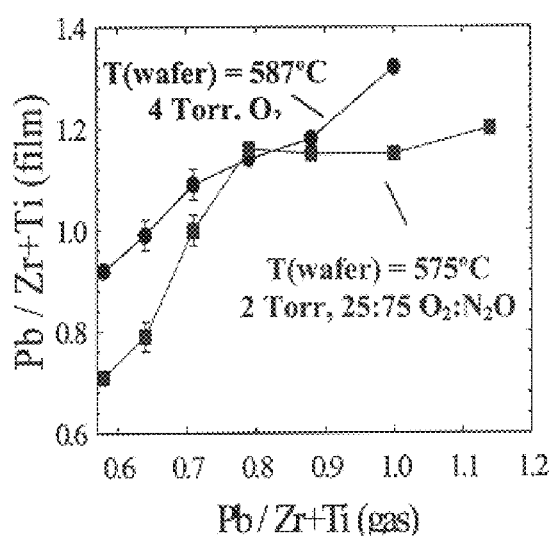
FIG. 10　　　　　FIG. 11

FERAM CAPACITOR POST STACK ETCH CLEAN/REPAIR

RELATED APPLICATION

This application claims priority to Ser. No. 60/353,692 filed Jan. 31, 2002, which is entitled "FeRAM Capacitor Post Stack Etch Clean/Repair".

FIELD OF THE INVENTION

The present invention relates generally to the field of integrated circuit processing, and more particularly relates to an FeRAM structure and a method of manufacture thereof having a capacitor stack etch which effectively etches the ferroelectric dielectric layer without degradation thereof.

BACKGROUND OF THE INVENTION

Several trends exist, today, in the semiconductor device fabrication industry and the electronics industry. Devices are continuously getting smaller and smaller and requiring less and less power. A reason for this is that more personal devices are being fabricated which are very small and portable, thereby relying on a small battery as its supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device which has a fair amount of memory and logic functions integrated onto the same semiconductor chip. Preferably, this memory will be configured such that if the battery dies, the contents of the memory will be retained. Such a memory device which retains its contents while a signal is not continuously applied to it is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as SBT or PZT, as the capacitor dielectric situated between a bottom electrode and a top electrode. Both read and write operations are performed for a FeRAM. The memory size and memory architecture affect the read and write access times of a FeRAM. Table 1 illustrates the differences between different memory types.

TABLE 1

| Property | SRAM | Flash | DRAM | FeRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >10$^{15}$ | <10$^5$ | >10$^{15}$ | >10$^{13}$ |
| Read Time (single / multi bit) | <10 ns | <30 ns | <30 ns/ <2 ns | 60 ns |
| Read Endurance | >10$^{15}$ | >10$^{15}$ | >10$^{15}$ | >10$^{13}$ |
| Added Mask for embedded | 0 | ~6–8 | ~6–8 | ~3 |
| Cell Size (F~metal pitch/2) | ~80 F$^2$ | ~8 F$^2$ | ~8 F$^2$ | ~18 F$^2$ |
| Architecture | NDRO | NDRO | DRO | DRO |
| Non volatile Storage | NO I | YES Q | NO Q | YES P |

The non-volatility of an FeRAM is due to the bi-stable characteristic of the ferroelectric memory cell. Two types of memory cells are used, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

As illustrated in prior art FIG. 1, a 1T/1C FeRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL)(e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bit line 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently the sense amplifier reference voltage is a ferroelectric or non-ferroelectric capacitor connected to another bit line that is not being read. In this manner, the memory cell data is retrieved.

A characteristic of the shown ferroelectric memory cell is that a read operation is destructive. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. The one difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bar-bar line 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bit line-bar line 34, respectively. A differential signal (not shown) is thus generated across the bit line 32 and the bit line-bar line 34 by the dual capacitor memory cell 30. The differential signal is sensed by a sense amplifier (not shown) that provides a signal corresponding to the logic level stored in memory.

A memory cell of a ferroelectric memory is limited to a finite number of read and write operations before the memory cell becomes unreliable. The number of operations that can be performed on a FeRAM memory is known as the endurance of a memory. The endurance is an important factor in many applications that require a nonvolatile memory. Other factors such as memory size, memory speed, and power dissipation also play a role in determining if a ferroelectric memory is viable in the memory market.

SUMMARY OF THE INVENTION

In essence, the instant invention relates to the fabrication of an FeRAM device which is either a stand-alone device or one which is integrated onto a semiconductor chip which includes many other device types. Several requirements either presently exist or may become requirements for the integration of FeRAM with other device types. One such requirement involves utilizing, as much as possible, the conventional front end and back end processing techniques used for fabricating the various logic and analog devices on the chip to fabricate this chip which will include FeRAM devices. In other words, it is beneficial to utilize as much of the process flow for fabricating these standard logic devices (in addition to I/O devices and potentially analog devices) as possible, so as not to greatly disturb the process flow (and thus increase the process cost and complexity) merely to integrate the FeRAM devices onto the chip.

The following discussion is based on the concept of creating the ferroelectric capacitors in a FeRAM process module that occurs between the front end module (defined to end with the formation of W contacts) and the back end process module (mostly metallization). Other locations of the FeRAM process module have also been proposed. For example, if the FeRAM process module is placed over the first layer of metallization then a capacitor over bar structure can be created with the advantage that a larger capacitor can be created. One disadvantage of the approach is that either Metal-1 or a local interconnect must be compatible with FeRAM process temperature (W for example) or the FeRAM process temperature must be lowered to be compatible with standard metallization (Al ~450 C., Cu-Low-K ~400 C). This location has some advantages for commodity memory purposes, but has cost disadvantages for embedded memory applications. Another proposed location for the FeRAM process module is near the end of the back end process flow. The principal advantage of this approach is that it keeps new contaminants in the FeRAM module (Pb, Bi, Zr, Ir, Ru, or Pt) out of more production tools. This solution is most practical if the assumption is that all of the equipment used after deposition of the first FeRAM film must be dedicated and can not be shared. This solution has the drawback of requiring FeRAM process temperatures compatible with standard metallization plus wiring of the FeRAM capacitor to transistor and other needs of metallization are not compatible with a minimum FeRAM cell size.

The requirements for the other locations will have many of the same concerns, but some requirements will be different.

The FeRAM process module must therefore be compatible with front end process flow including the use of W contacts (currently standard in most logic flows) as the bottom contact of the capacitor. The FeRAM thermal budget must also be low enough so that it does not impact the front end structures such as the low resistance structures (such as tungsten plugs and silicided source/drains and gates) required by most logic devices. In addition, transistors and other front end devices such as diodes are sensitive to contamination and the FeRAM process module can not contaminate these devices either directly (diffusion in chip) or indirectly (cross contamination through shared equipment). The FeRAM devices and process module must also be compatible with a standard back end process flow. Therefore the FeRAM process module must have minimum degradation of logic metallization's resistance and parasitic capacitance between metal and transistor. In addition, the FeRAM devices must not be degraded by the back end process flow with minimal, if any, modification. This is a significant challenge since ferroelectric capacitors have been shown to be sensitive to hydrogen degradation and most logic back end process flows use hydrogen/deuterium in many of the processes ($SiO_2$, $Si_3N_4$, and CVD W deposition, $SiO_2$ via etch, and forming gas anneals).

Commercial success of FeRAM also requires minimization of embedded memory cost. Total memory cost is primarily dependent on cell size, periphery ratio size, impact of yield, and additional process costs associated with memory. In order to have a cost advantage per bit compared to standard embedded memories such as embedded DRAM and Flash it is necessary to have cell sizes that are not much larger than these competing technologies. Some of the methods discussed in this patent to minimize cell size is to make the process flow less sensitive to lithography misalignment, have the capacitor directly over the contact, and using a single mask for the capacitor stack etch.

In accordance with one aspect of the present invention, a method of forming an FeRAM capacitor is provided in which a post capacitor stack etch clean/repair procedure is employed. Unlike prior art wet etch solutions that remove damaged PZT material on the capacitor stack PZT sidewall, the present invention repairs PZT etch damage without any substantial removal of PZT material. In doing so, further damage to the PZT layer via potential alteration of the PZT microstructure is avoided. In addition, potential reliability issues relating to undercut of the PZT layer due to wet etch material removal is eliminated. That is, since PZT material suffering etch damage is not removed, but rather is repaired, the subsequent formation of the sidewall diffusion barrier provides a more effective barrier.

In accordance with another aspect of the present invention, a method of performing a post-capacitor stack etch clean/repair is disclosed. The method comprises forming a capacitor stack by etching a top electrode layer, a PZT layer, and a bottom electrode layer using a patterned hard mask. The method further comprises repairing damage to the PZT layer after the capacitor stack etch by controlling the lead activity and therefore the lead composition associated therewith. In one exemplary aspect of the invention, the damage is repaired by exposing, in an elevated thermal environment, the etched capacitor stack to a lead source material with oxygen having a vapor pressure that is greater than the vapor pressure of the damaged PZT material. The Pb overpressure facilitates vapor transport of lead (for example, lead oxide) from the source material to the damaged PZT thereby repairing the etch damage and filling point defects therein.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 8–11 are graphs illustrating various performance characteristics of a PZT ferroelectric film formed in accordance with the present invention;

DETAILED DESCRIPTION OF THE INVENTION

The present invention will now be described with respect to the accompanying drawings in which like numbered elements represent like parts. While the following description of the instant invention revolves around the integration of the FeRAM devices with logic devices and other devices which can be found on a digital signal processor, microprocessor, smart card, microcomputer, microcontroller or system on a chip, the instant invention can be used to fabricate stand-alone FeRAM devices or FeRAM devices integrated into a semiconductor chip which has many other device types. In particular, the improved performance of the FeRAM device of the instant invention compared to standard semiconductor memories appears to make FeRAM the memory of choice for any handheld device which requires low power and large degree of device integration.

The figures provided herewith and the accompanying description of the figures are merely provided for illustrative purposes. One of ordinary skill in the art should realize, based on the instant description, other implementations and methods for fabricating the devices and structures illustrated in the figures and in the following description. For example, while shallow trench isolation structures ("STI") are illustrated, any conventional isolation structures may be used, such as field oxidation regions (also known as LOCOS regions) or implanted regions. In addition, while structure 102 is preferably a single-crystal silicon substrate which is doped to be n-type or p-type, structure 102 (FIG. 3) may be formed by fabricating an epitaxial silicon layer on a single-crystal silicon substrate.

In accordance with the present invention, a plurality of methods are disclosed which decrease a reduction of an iridium oxide bottom electrode during a subsequent formation of a ferroelectric dielectric layer in an FeRAM capacitor. By decreasing a reduction of the iridium oxide bottom electrode, a fatigue resistance of the FeRAM cell is improved substantially over the prior art.

Figure 1:
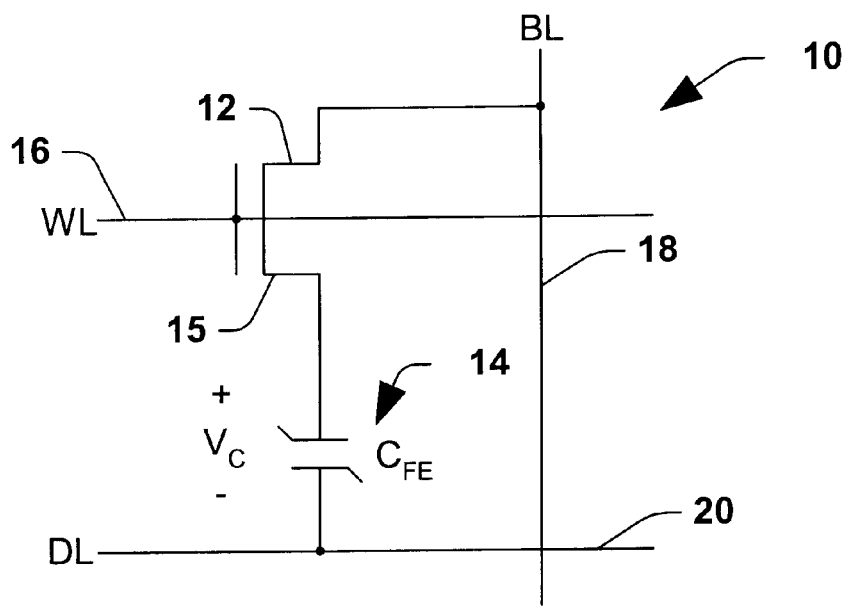
FIG. 1 is a prior art schematic diagram illustrating an exemplary 1T/1C FeRAM memory cell.
Figure 2:
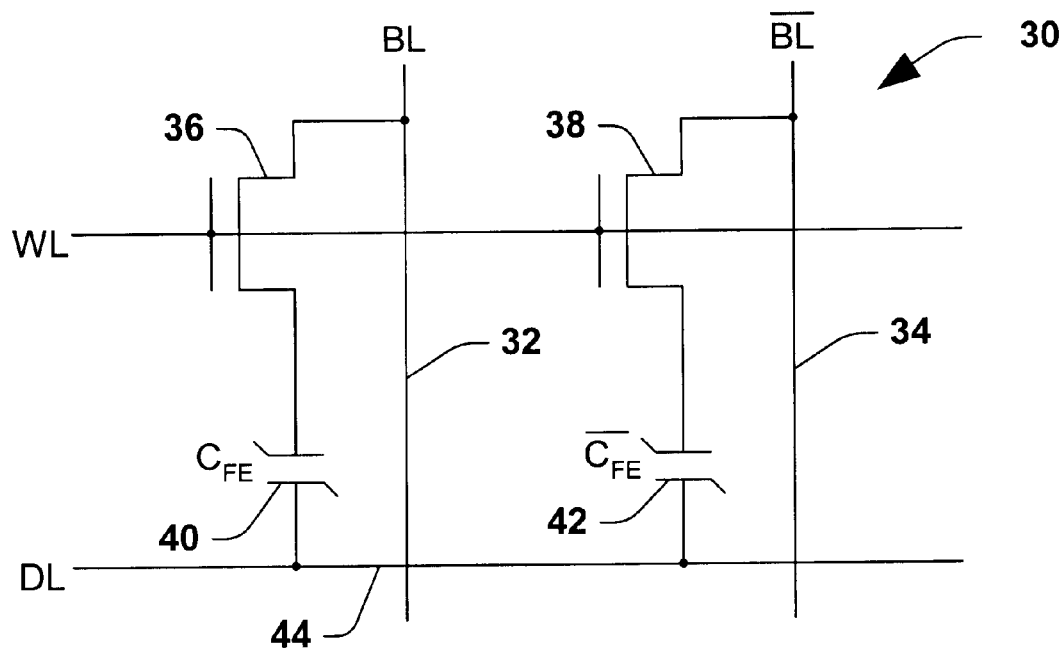
FIG. 2 is a prior schematic diagram illustrating an exemplary 2T/2C FeRAM memory cell.
Figure 3:
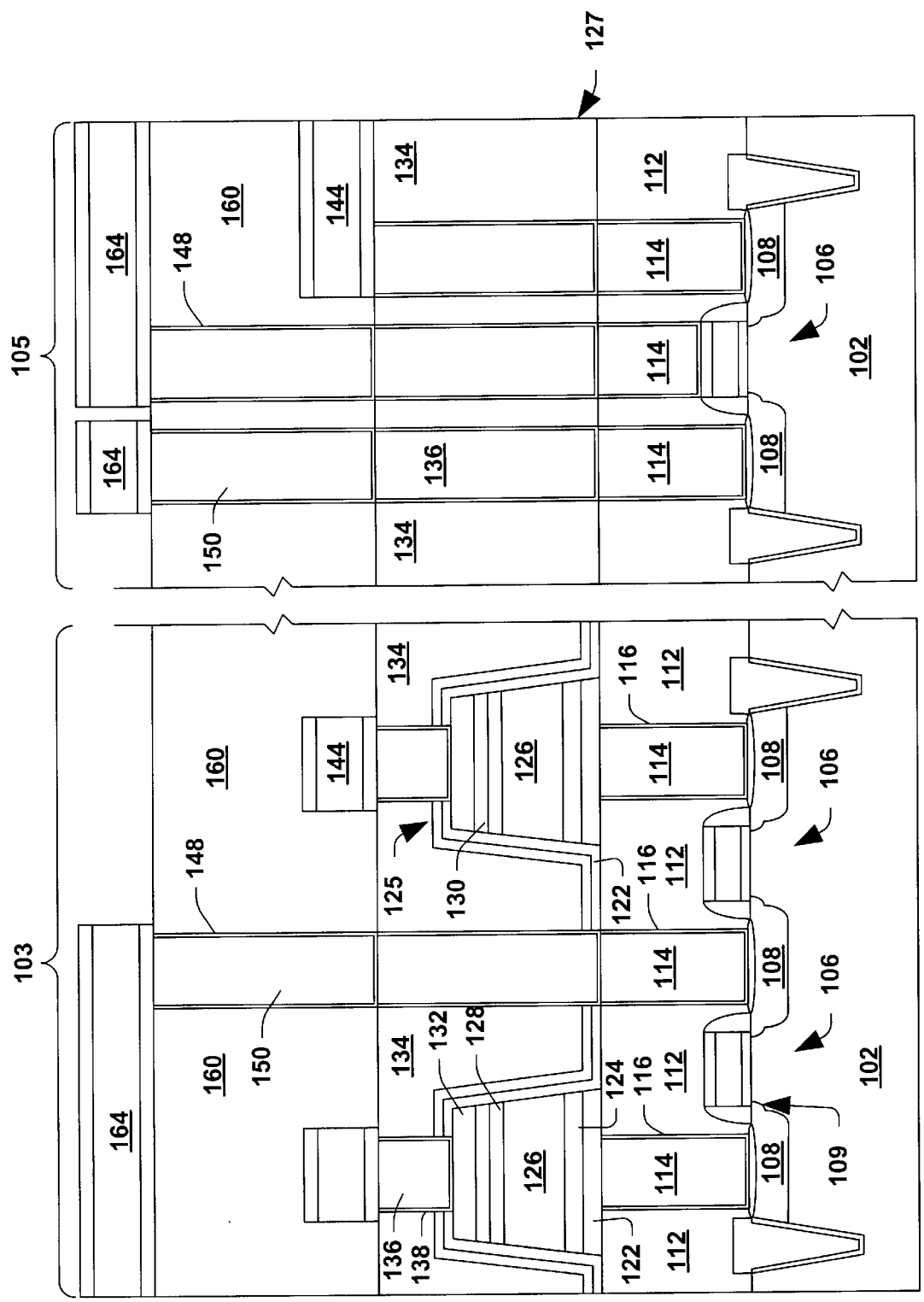
FIG. 3 is a fragmentary cross-sectional view of a partially fabricated device containing FeRAM capacitors and transistors associated therewith fabricated in accordance with one exemplary aspect of the present invention.

Referring initially to FIG. 3, an exemplary, fragmentary cross section of a semiconductor device 100 is provided in which two devices are illustrated. A first device 103 represents a partially fabricated version of am FeRAM cell in accordance with the present invention, and a second device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in the device 103, the structures utilized therein may be the same as the device structures of the device 105 (except for some possible variations in the transistors due to the different device types that device 105 may be).

Basically, gate structures 106 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 106 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 108 may be formed via, for example, implantation using conventional dopants and processing conditions. Lightly doped drain extensions 109 as well as pocket implants may also be utilized. In addition, the source/drain regions 108 may be silicided (for example, with titanium, cobalt, nickel, tungsten or other conventional silicide material).

Figure 4:
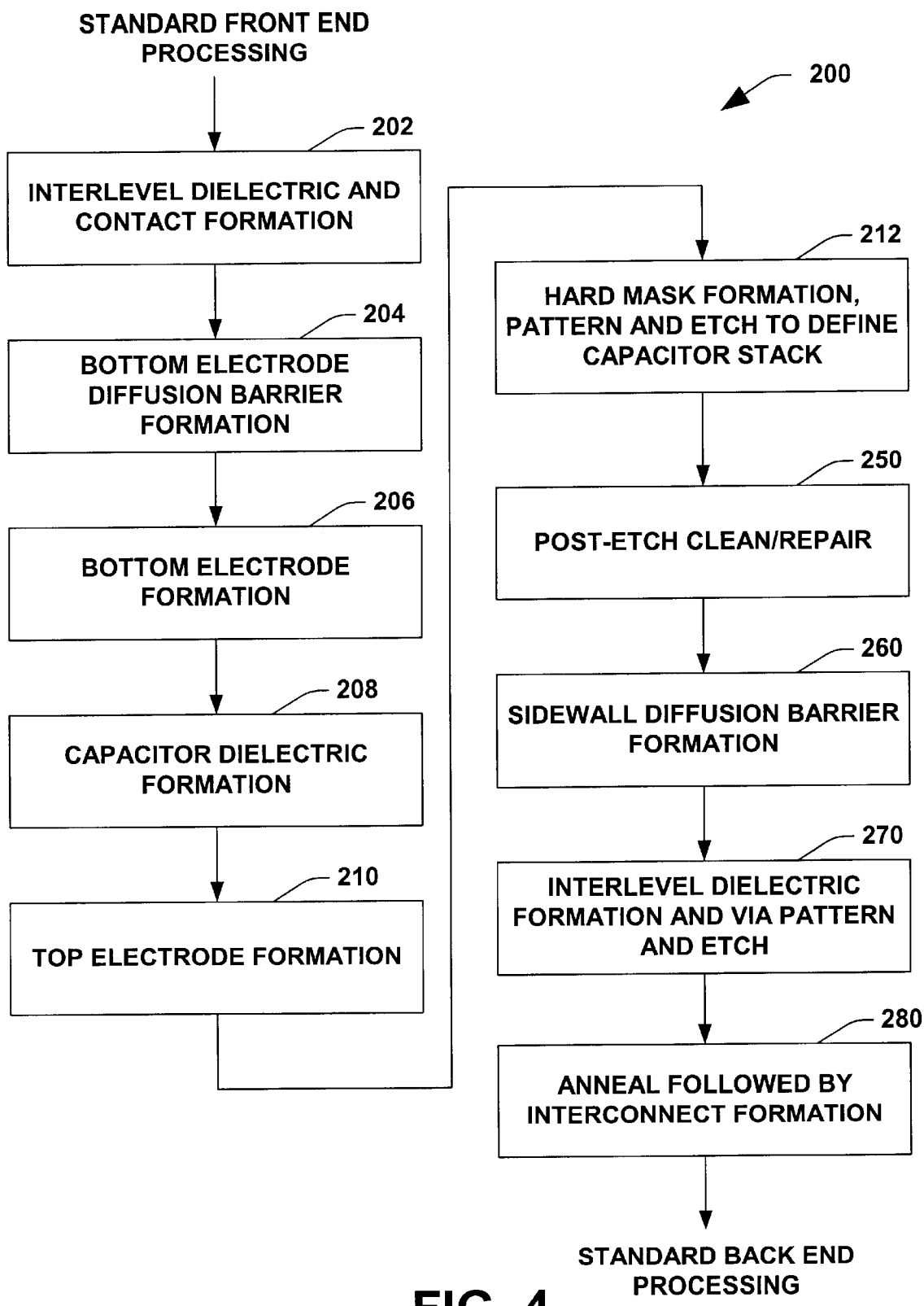
FIG. 4 is a flow chart diagram illustrating a method of forming an FeRAM capacitor in accordance with another exemplary aspect of the present invention.

A dielectric layer 112 is formed over the entire substrate 102 and is patterned and etched so as to form openings for contacts to the substrate and gate structures 106 to be formed (see, e.g., step 202 of FIG. 4). These openings are filled subsequently with one or more conductive materials, such as a plug 114 (for example, comprising a metal such as tungsten, molybdenum, titanium, titanium nitride, tantalum nitride, or a metal silicide such as Ti, Ni or Co, copper or doped polysilicon). A liner/barrier layer 116 may or may not be formed between the plug 114 and dielectric 112. Such a liner/barrier layer 116 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 112 comprises, for example, $SiO_2$ (doped or undoped with preferable dopants such as boron or phosphorous) possibly with a layer of hydrogen or deuterium containing silicon nitride next to the gate. After deposition of the diffusion barrier 116 it is likely that the barrier will be planarized for improved lithography of overlying layers using a process such as chemical mechanical polishing (CMP). In addition, an added diffusion barrier/etch stop (not shown) may be included near the top surface of layer 112 such as $AlO_X$, AlN, $Si_3N_4$, $TiO_2$, $ZrO_2$, or $TaO_X$ that would be deposited after the planarization process. This diffusion barrier is particularly useful if damascene processes are used to create the via or metallization to the contact. The formation of the plug 114 will require etching through this optional barrier/etch stop.

Formation of metal structures which are situated above the contacts is considered to be part of the back end processes. Other than the specific FeRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 112,134 and 160). If formed, this thin dielectric comprises, for example, silicon nitride, silicon carbide, SiCNO or a silicon oxide (for example, a high-density plasma oxide). In addition, interlevel dielectric layers 112,134, and 160 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 136 and 150 and conductors 144 and 164 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 138 and 148 and liners 142, 146, 162 and 166) comprises, for example, Ti, TiN, W, tungsten nitride, Ta, tantalum nitride, any conventional barrier/liner layer, or any combination or stack thereof). The interlayer dielectric and plug material should be compatible with the FeRAM thermal budget. With existing technology (i.e., one that incorporates a W plug and $SiO_2$ ILD), the FeRAM thermal budget should be less than approximately 600 or 650 C., however, the present invention is not limited thereto. If the ILD is modified to include a low dielectric constant ("low K") layer, the FeRAM thermal budget may need to be reduced further. The preferred interlayer dielectric 112 is therefore a material that can withstand a thermal budget in excess of 600 C., such as silicon oxide (doped and/or undoped), silicon nitride, and/or silicon oxy-nitride.

Level 127 is added so as to accommodate the FeRAM cells (FeRAM process module). This FeRAM process module allows the creation of ferroelectric or high dielectric constant capacitors to be easily added with maximum thermal budget for the new process module yet not impact the thermal budget of backend process. In particular, this level allows FeRAM devices with capacitor under bit line configuration compatible with a high-density memory. However, it is possible, if planarity is not a necessity, to form the FeRAM devices while not forming layer 127 in region 105. Hence, the FeRAM portion 103 would be taller than the region 105 by the height of layer 127.

Initially, a further discussion of FIG. 3 will be provided to appreciate the structure of an FeRAM cell and an exemplary integration position of such a cell within a semiconductor fabrication process. Subsequently, a flow chart and a number of fragmentary cross section diagrams will be provided to illustrate an exemplary process for fabricating such an FeRAM cell in order to provide a context in which the present invention may reside. In conjunction therewith, the present invention will be described and illustrated in greater detail. It should be understood, however, that although the present invention will be shown and described in conjunction with one exemplary context, the invention is applicable to other fabrication methodologies, structures and materials, and such alternatives are contemplated as falling within the scope of the present invention.

An FeRAM capacitor, as illustrated in FIG. 3 at reference numeral 125, resides above the interlayer dielectric 112, and comprises several layers. The FeRAM capacitor 125 of FIG. 3 comprises an electrically conductive barrier layer 122 upon which a conductive bottom capacitor electrode 124 resides (hereinafter, the terms conductive and insulative are employed to indicate electrically conductive and electrically insulative, respectively, unless indicated otherwise). A capacitor dielectric layer 126, a ferroelectric material, is formed over the bottom electrode 124, and is covered by, for example, a conductive multi-layer top electrode 128, 130. A top portion of the FeRAM capacitor 125 comprises a hard mask layer 132 which, as will be discussed in greater detail later, may be employed to facilitate the capacitor stack etch. The capacitor stack is then covered by a multi-layer sidewall diffusion barrier 118, 120.

An exemplary method of forming an FeRAM capacitor in accordance with the present invention which is similar in many respects to the capacitor 125 of FIG. 3 will now be discussed in conjunction with FIG. 4, wherein a method 200 of forming an FeRAM capacitor is disclosed. At 202, the interlevel dielectric 112 is formed and conductive contacts, for example, tungsten (W) contacts 114 are formed therein with a barrier layer 116 (e.g., TiN) disposed therebetween to avoid oxidation of the tungsten contacts. Formation of the interlayer dielectric 112 and the contacts 114 may be formed by various means and any such process is contemplated as falling within the scope of the present invention. Then the FeRAM capacitor(s) are formed over the interlayer dielectric 112 and the contacts 114, as illustrated in FIG. 3.

Start of FeRAM Module Processing
Deposition of the Ferroelectric Stack: Bottom electrode diffusion barrier According to one aspect of the present invention, once the interlayer dielectric 112 and the tungsten contacts 114 are formed, the FeRAM capacitor formation process begins. According to one prior art fabrication technique, a bottom electrode was formed directly over the interlayer dielectric, however, the bottom electrode material, for example, an iridium or an iridium/iridium oxide multi-layer would not provide a sufficient diffusion barrier (e.g., oxygen or hydrogen) during subsequent processing. That is, during the subsequent formation of the ferroelectric dielectric, for example, oxygen would diffuse through the bottom electrode and cause the tungsten to oxidize, thus increasing disadvantageously a resistance between the contact and the FeRAM capacitor. One solution to the above problem is to increase a thickness of the bottom electrode. Since a bottom electrode material acts in some fashion as a diffusion barrier, by increasing the thickness thereof, less diffusion would pass therethrough. Such a solution, however, disadvantageously increases the thickness of the FeRAM capacitor which preferably is as thin as possible.

In order to overcome the above disadvantages, another prior art solution provided a dedicated bottom electrode diffusion barrier layer. Such a barrier layer is formed over the interlayer dielectric and the tungsten contact prior to the formation of the bottom electrode. Such a barrier is electrically conductive and serves to provide an effective diffusion barrier without having to increase a thickness of the bottom electrode. Since the diffusion barrier is a more efficient barrier than the bottom electrode material(s), even though the additional barrier is employed, the net thickness is less than would otherwise be required if the bottom electrode material was increased to provide an equivalent barrier performance. The prior art bottom electrode diffusion barrier material was TiAlN, and was formed via physical vapor deposition.

The prior art TiAlN diffusion barrier provides an effective barrier for diffusion of materials such as oxygen and hydrogen. A problem has been discovered by the inventors of the present invention that the TiAlN material is a source of integration problems during subsequent processing of the FeRAM capacitor. More particularly, it was discovered that during subsequent processing of the FeRAM capacitor stack (via etching), an etching of the TiAlN barrier layer between neighboring FeRAM capacitor cells caused a substantial undercutting of the TiAlN beneath the capacitor stack and such phenomena negatively contributed to poor step coverage of a subsequently formed electrically insulating FeRAM sidewall diffusion barrier. Consequently, the overall diffusion barrier (top, bottom and sidewalls) of the FeRAM capacitor is compromised. In order to fully appreciate the problem associated therewith, a discussion of the FeRAM capacitor stack etch will be discussed in conjunction with FIGS. 5–6.

Figure 5:
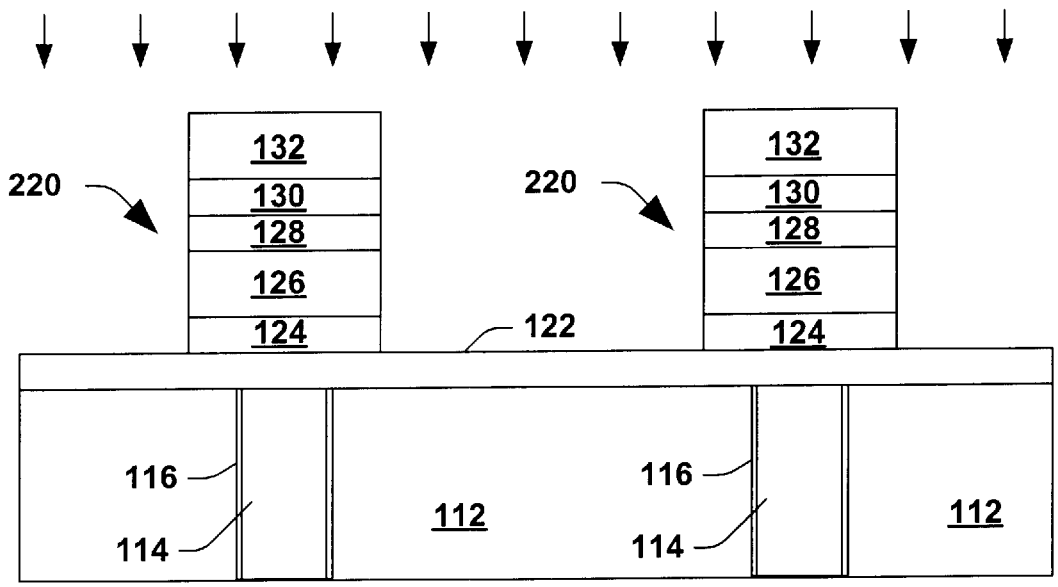
FIGS. 5 and 6 are fragmentary cross-sectional views of two neighboring FeRAM capacitor stacks having a bottom electrode diffusion barrier layer etched and a result thereof.

After the TiAlN bottom electrode diffusion barrier layer 122 is formed, the bottom electrode layer 124, the ferroelectric dielectric layer 126, the top electrode layer 128, 130, and a hard mask layer 132 are deposited and subsequently etched using the hard mask to self-align one or more FeRAM capacitor stacks 220, as illustrated in FIG. 5. The TiAlN bottom electrode diffusion barrier 122 also needs to be etched because TiAlN is electrically conductive and without further etching, the barrier layer 122 would short the neighboring capacitors together.

Figure 6:
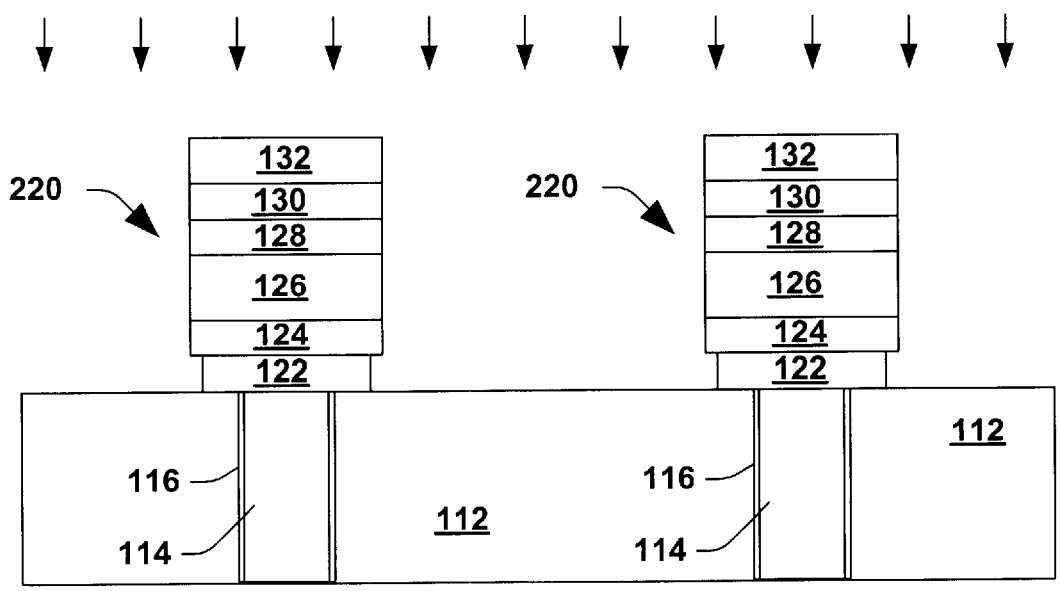

An etch of the exposed TiAlN barrier 122 between neighboring FeRAM capacitor stacks is performed typically using a dry, chlorine based etch and ideally would be anisotropic. However, the inventors have noted that the chlorine etch has a significant chemical component that causes the etch to be relatively isotropic, resulting in an undercutting of the FeRAM stacks, as illustrated in FIG. 6. Although such an undercut would not appear to negatively impact the capacitor performance, it has been discovered that such undercutting negatively impacts the step coverage of a subsequently deposited sidewall diffusion barrier (not shown). Consequently, the TiAlN barrier layer 122, due to integration problems, results in degradation in the subsequently formed sidewall diffusion barrier, thereby negatively impacting the capacitor performance.

The inventors of the present invention have overcome the difficulties of the problem highlighted above by replacing the TiAlN barrier layer with a TiAlON barrier layer at 204 of FIG. 4. Such a replacement, however, is not a mere substitution of another material because one of ordinary skill in the art would not be motivated to add oxygen because such an addition increases the electrical resistance of the resulting layer. As discussed previously, it is desirable to keep the resistance of the barrier layer as low as possible to thereby reduce the resistance between the bottom electrode of the FeRAM capacitor and the underlying transistor through the tungsten contact. The inventors of the present invention, however, discovered that by adding a small amount of oxygen, one could obtain a substantial reduction in the isotropy of the chlorine etch without substantially increasing a resistivity of the barrier layer, that is, increasing the resistivity above a predetermined level.

According to one exemplary aspect of the present invention, the composition of the TiAlON is tuned to provide sufficient aluminum therein for adequate oxidation resistance (of the underlying tungsten contact(s)) and enough oxygen to prevent undercutting during an etch thereof, yet concurrently maintaining the resistivity thereof low enough to prevent any appreciable degradation of the electrical performance of the circuit. In one example, the aluminum composition is at least about 20 cation atom %, and less than about 50 cation atom %; and the oxygen composition is at least about 5 anion atom %, and less than about 50 anion atom %. In another example, the aluminum composition is at least about 35 cation atom %, and less than about 45 cation atom %; and the oxygen composition is at least about 10 anion atom %, and less than about 20 anion atom %.

In accordance with one exemplary aspect of the present invention, it is desirable to have a barrier resistivity of about 4300 $\mu\Omega$-cm or less. Therefore in tailoring the TiAlON bottom electrode diffusion barrier film, it is desired to keep the amount of oxygen therein sufficiently low such that the resistivity does not exceed substantially the 4300 $\mu\Omega$-cm figure. For example, with a TiAlON content of about Ti≈0.5, Al≈0.4, O≈0.1, and N≈0.9, a film resistivity of about 1800 $\mu\Omega$-cm was obtained. Such a TiAlON film is formed, for example, via a PVD or sputter deposition process using an Endura TTN™ chamber with a heater temperature of 400 C., Ar heater 15 sccm, Ar chamber 56 sccm, O$_2$ chamber 9 sccm, cryo pump. In addition, with such a barrier, experimental tests indicate that the etch rate is about 150 nm/min using a BCl$_3$+Cl$_2$ chemistry and is about 15 nm/min with solely Cl$_2$, compared to a TiAlN etch rate of about 300 nm/min. Consequently, the TiAlON barrier of the present invention provides a substantial reduction in etch isotropy with an acceptable increase in resistivity.

In addition, another alternative method of forming the TiAlON film is via MOCVD using TiAlN (creating TiAlCON). The composition is tuned in order to obtain enough Al for oxidation resistance and enough oxygen for etch undercut yet keeping the resistance low enough so as not to degrade the electrical performance.

The inventors of the present invention also ascertained that the CMP process used to planarize the interlayer dielectric 112 and the tungsten contact 114 generates seams in the tungsten contact. Most seams are about 200–400 Angstroms in diameter and are adequately filled by the subsequently formed barrier layer, for example, TiAlN. However, a small percentage of such seams are substantially larger, for example, about 600–800 Angstroms in diameter. With such larger seams, the conventional barrier layer, formed via physical vapor deposition (PVD), does not adequately fill the seam due to necking, for example. Such poor seam coverage may undesirably increase the contact resistance between the underlying transistor and the FeRAM capacitor.

In accordance with one aspect of the present invention, the large seams in the tungsten contact 114 are addressed by making the diffusion barrier layer a multi-layer, with a first layer of TiN formed over the interlayer dielectric 112 and the tungsten contact 114 via chemical vapor deposition (CVD). Due to the CVD process, the TiN exhibits exemplary step coverage, thus filling in a portion of any large seams in the tungsten contacts. For example, a TiN layer of about 100 Angstroms reduces a seam having a diameter of about 600 Angstroms to about 400 Angstroms. Since a CVD TiN process is employed as the contact barrier for tungsten contacts, the well-developed and characterized process may be employed readily for such a first layer barrier. The second layer of the multi-layer barrier is then formed over the CVD TiN, for example, a TiAlN film or a TiAlON film for the reasons highlighted above. Because the TiN layer has reduced the size of any large seams, the second layer (formed via PVD, for example) easily fills the reduced size seam, and accordingly any potential increase in resistivity due to the seam is substantially eliminated.

Therefore in accordance with one aspect of the present invention, the bottom electrode diffusion barrier comprises a bi-layer process. For example, first a CVD TiN film is formed having a thickness of about 40 nm, followed by a PVD TiAlN film of about 30 nm. In accordance with one exemplary aspect of the present invention, the TiAlN have at least about 30% aluminum, and less than about 60%. Alternatively, the TiAlN has at least about 40% aluminum, and less than about 50% in order to exhibit improved oxidation resistance.

In the above example, TiAlN is discussed as one form of diffusion barrier in conjunction with the initial TiN layer. Alternatively, a TiAlON layer as discussed above may be utilized in conjunction with the TiN; and other diffusion barrier layers may be employed, for example, TaSiN, TiSiN, TaAlN, Ti, TiN, Ta, TaN, HfN, ZrN, HfAlN, CrN, TaAlN, CrAlN. The preferred deposition technique for these barrier layers are reactive sputter deposition using Ar+N$_2$ or Ar+NH$_3$. Other deposition techniques that might be used include CVD or plasma enhanced CVD. In any event, it is preferred to use materials that have a slower oxidation rate than TiN.

In addition to the discussion above regarding the diffusion barrier layer, it is desirable to perform a clean operation of the interlayer dielectric 112 and the tungsten contact 114 prior to the deposition of the barrier layer. For example, one option is to sputter clean with Ar prior to the deposition of the barrier layer. It is further preferred that this pre-clean occur without a vacuum break prior to the deposition of the barrier.

Deposition of the Ferroelectric Stack: Bottom electrode

The next layer is the oxygen stable bottom electrode 124, as illustrated at 206 of FIG. 4. This layer needs to be stable during the subsequent deposition of the ferroelectric and can strongly impact the properties of the ferroelectric capacitor. For example, with a PZT ferroelectric the reliability is improved with oxide electrodes. The electrode experiences the thermal budget and oxidizing conditions of the ferroelectric deposition and possibly anneal. Therefore the bottom electrode preferably is stable in oxygen and does not form insulating layers as a result of such oxygen. It is also advantageous that the bottom electrode at least partially impedes the oxidation and reaction of the underlying diffusion barrier.

In addition, the electrode preferably maintains a relatively low contact resistance. A list of possible materials includes Pt, Pd, PdOx, IrPt alloys, Au, Ru, RuO$_x$, (Ba,Sr,Pb)RuO3, (Sr,Ba,Pb)IrO3, Rh, RhO$_x$, LaSrCoO$_3$, (Ba,Sr)RuO$_3$, LaNiO$_3$.

The bottom electrode 124 of the capacitor is formed either with or without the barrier layer 122 so as to make electrical connection with the underlying contact structure 114. Preferably, the bottom electrode 124 is around 30–100 nm thick, is stable in oxygen and is comprised of a noble metal or conductive oxide such as iridium, iridium oxide, Pt, Pd, PdOx, Au, Ru, RuO$_x$, Rh, RhO$_x$, LaSrCoO$_3$, (Ba,Sr)RuO$_3$, LaNiO$_3$ or any stack or combination thereof. For any electrode using noble metals it is advantageous from a cost and ease of integration standpoint to use layer as thin as possible.

For a PZT dielectric, it is preferred to have an oxide electrode such as IrOx in contact therewith at the top and/or bottom electrode. In addition, it is preferred to have a noble metal between the conductive oxide electrode and either the top or bottom diffusion barrier. The noble metal prevents oxidation of the diffusion barrier and the resulting formation of an insulating layer which increases undesirably the contact resistance. The preferred thickness of this noble metal layer is 10–30 nm. Thus in one aspect of the invention, the bottom electrode 124 comprises an Ir/IrO$_2$ sandwich.

The preferred bottom electrode for PZT is either 50 nm Ir deposited by sputter deposition for Ir (Ar) and/or reactive sputter deposition (Ar+$O_2$) for IrOx. A second preferred electrode stack uses 10 nm Ir on 30 nm IrOx on 20 nm Ir (one potential thickness is shown). A third preferred embodiment is IrOx (~30–40 nm) on Ir (20–30 nm). The preferred deposition technique for these layers is sputter or reactive sputter deposition or chemical vapor deposition.

Deposition of the Ferroelectric Stack: Ferroelectric

The capacitor dielectric 126 is formed on the bottom electrode 124, as illustrated at 208 of FIG. 4. Preferably, the capacitor dielectric is less than 150 nm thick (more preferably less than 100 nm thick-most preferably less than 50 nm thick) and is comprised of a ferroelectric material, such as Pb(Zr,Ti)$O_3$ PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3 etc.

PZT is a desirable choice for the capacitor dielectric because it has the highest polarization and the lowest processing temperature of the aforementioned materials. Thin PZT (<100 nm) is extremely advantageous in making integration more simple (less material to etch) and less expensive (less material to deposit therefore less precursor). Because PZT has the largest switched polarization, it is also possible to minimize capacitor area using such material.

The preferred deposition technique for these dielectrics is metal organic chemical vapor deposition (MOCVD). MOCVD is preferred especially for thin films (<100 nm). MOCVD also permits the film thickness to be scaled without significant degradation of switched polarization and coercive field, yielding PZT films with a low operating voltage and large polarization values. In addition, the reliability of the MOCVD PZT film is better than that generally obtained using other deposition techniques, particularly with respect to imprint/retention.

Figure 7:
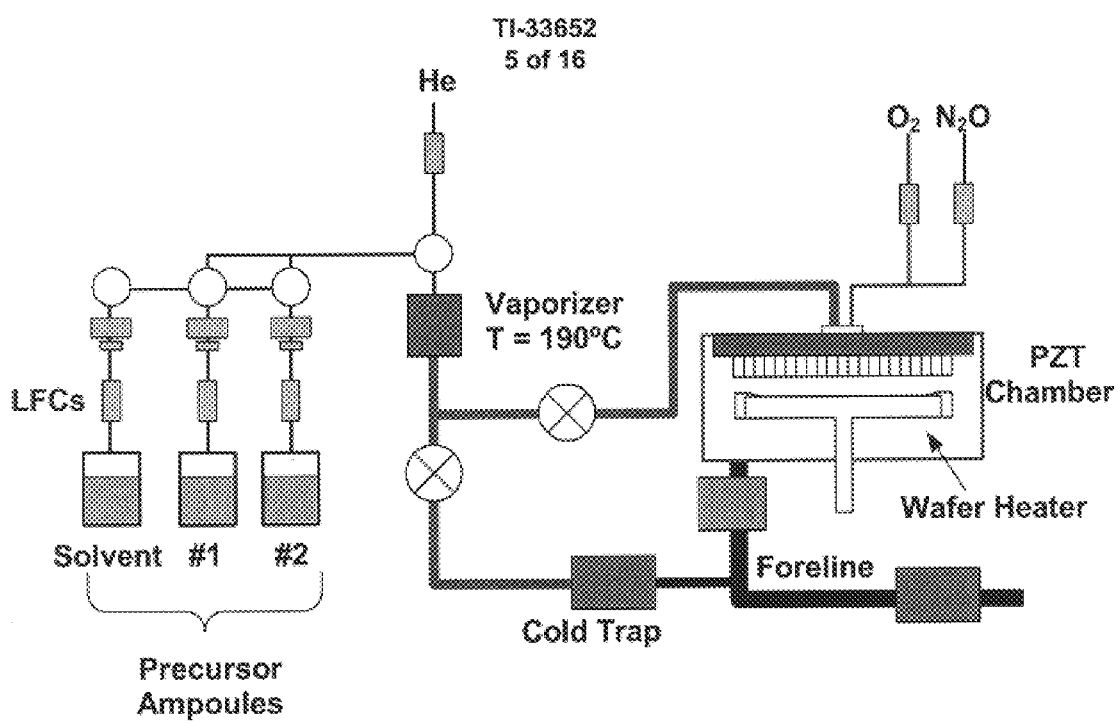
FIG. 7 is a schematic diagram illustrating an apparatus for forming a PZT ferroelectric film in accordance with the present invention.

Specifically, in one example, MOCVD PZT ferroelectric films are grown in an Applied Materials 200 mm MOCVD Giga-Cap™ chamber integrated with a liquid delivery system and vaporizer installed on a Centura™ mainframe, as illustrated in FIG. 7. The baseline PZT film deposition parameters are described in Table PZT1 provided herein below, and the preferred metalorganic precursors are detailed in Table PZT2, also provided infra. Use of the pre-mixed precursor "cocktails" described in Table PZT2 provides enhanced repeatability and throughput relative to the use of elemental precursor solutions. The precise composition and molarity of the starting precursor solutions can be varied as needed. Use of pre-mixed "cocktails" permits hardware simplification since only a single vaporizer is needed. Earlier processes employed multiple elemental precursors and required two vaporizers rather than the simplified configuration shown in FIG. 7.

The preferred process sequence 208 proceeds as follows. After the wafers are delivered to the CVD chamber, the wafer sits on the lift pins above the wafer heater for about 30 sec (shorter times are also possible, for example, ~5 sec to 30 sec). This allows the wafer to pre-heat, avoiding thermal shock, which causes the wafer to break. Next, the wafer is lowered onto the wafer heater and the temperature is allowed to stabilize for about 60 sec. During these first two steps, the metalorganic precursors are sent directly to the vaporizer bypass line, bypassing the process chamber. PZT deposition begins once the precursor flow is diverted into the CVD chamber by opening the chamber valve and closing the bypass valve. The process parameters shown in Table PZT1 provide a deposition rate of approximately 160 Å/min. PZT deposition ends when the precursors are sent back to the vaporizer bypass line. Following deposition, the wafer remains in the chamber for 5 sec with the throttle valve open to evacuate the chamber before opening the slit valve between chambers for removal.

TABLE PZT1

Preferred process parameters for depositing PZT thin films by MOCVD.

| | |
|---|---|
| Heater Temperature | 640 to 650° C. |
| Wafer Temperature | ~600 to 609° C. |
| Pre-Deposition Time on Chuck | 30 sec on-pins / 60 sec on-heater |
| He B Carrier Flow Through Vaporizer #1 | 250 sccm |
| He B Carrier Flow Through Vaporizer #2 | 250 sccm |
| Oxygen Flow | 1000 sccm |
| Ar Purge Flow | 250 sccm |
| Ar Push Gas Pressure on Precursor Ampoules | 60 psi |
| Vaporizer Temperature | 190° C. |
| Jackets / Lid / Feedthrough Temperatures | 190° C. |
| Showerhead to Heater Spacing | 350 mils |
| Chamber Pressure | 4 Torr |
| Precursor #1 Flow (PZTG-2103) | 65 to 82 mg/min |
| Precursor #2 Flow (PZTG-2104) | 118 to 135 mg/min |
| Total Precursor Flow | 200 mg/min |
| Pb/(Zr+Ti) (in liquid) | 1.00 to 1.14 |
| Zr/(Zr+Ti) (in liquid) | 0.40 |
| Deposition Rate | 160 Å/min |
| Substrate | Ir (100 nm) / $Si_3N_4$ / $SiO_2$ / Si and $IrO_x$ (50 nm) / Ir (50 nm) / $Si_3N_4$ / $SiO_2$ / Si |

TABLE PZT2

Metalorganic precursors employed for CVD PZT deposition. Precursors were purchased from Advanced Technology Materials (ATMI).

| Ampoule | Precursor | Pb Conc (Molar) | Zr Conc (Molar) | Ti Conc (Molar) |
|---|---|---|---|---|
| #1 | Pb(thd)$_2$-pmdeta, Zr(O-iPr)$_2$(thd)$_2$, and Ti(O-iPr)$_2$(thd)$_2$ in an octane-based solvent system (ATMI Product #: PZTG-2103) | 0.090 | 0.090 | 0.135 |
| #2 | Pb(thd)$_2$-pmdeta + Zr(O-iPr)$_2$(thd)$_2$ + Ti(O-iPr)$_2$(thd)$_2$ in octane-based solvent system (ATMI Product #: PZTG-2104) | 0.205 | 0.045 | 0.066 |

Figure 8:
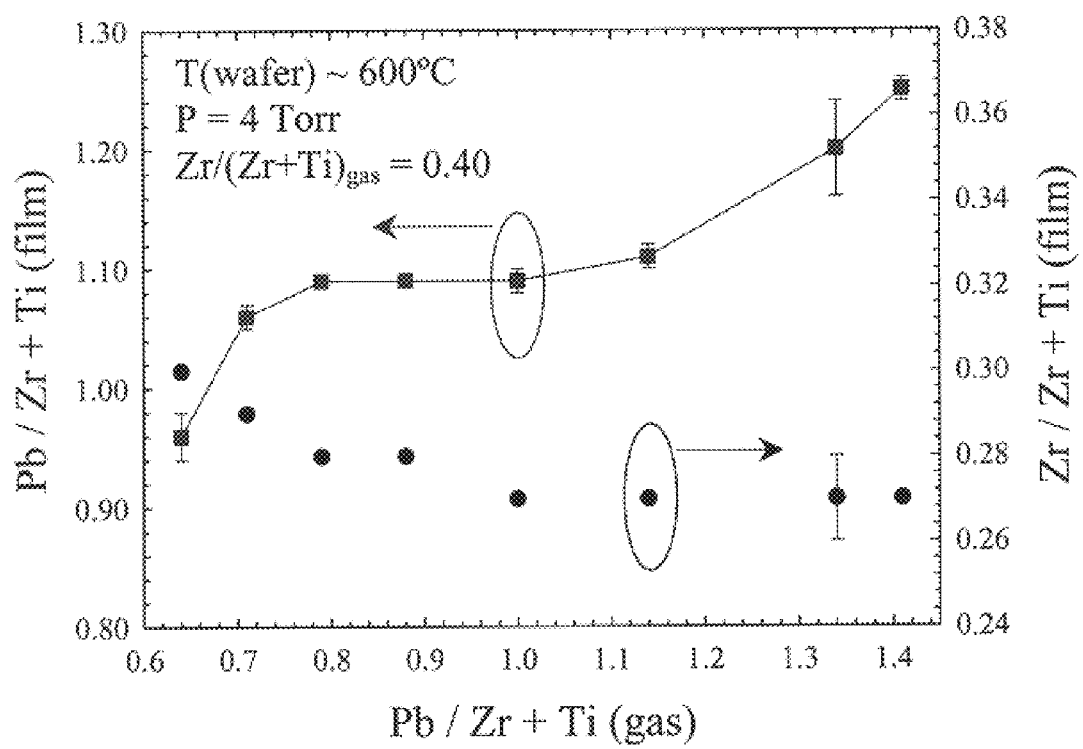

In accordance with one example, the dependence of film Pb/(Zr+Ti)$_{film}$ ratio and the Pb/(Zr+Ti)$_{gas}$ ratio in the gas phase is illustrated in FIG. 8. The process described in Table PZT1 provides the characteristic plateau region in which the Pb composition in the film is self-correcting. Generally, the plateau region, an example of which is shown in FIG. 8, is the processing regime that provides the optimum PZT properties. Using the preferred process parameters in Table PZT1, the self-correcting plateau is observed between Pb/(Zr+Ti)$_{gas}$ ratios of approximately ~0.8 and 1.3 for a wafer temperature of about 600° C. (heater set point temperature of about 640° C.). Within this composition region, stoichiometric, single-phase, (111)-textured PZT thin films are obtained. The optimum physical and electrical properties are observed within the more narrow range of Pb/(Zr+Ti)$_{gas}$=1.00 to 1.14, with a preferred ratio of 1.07.

Figure 9:
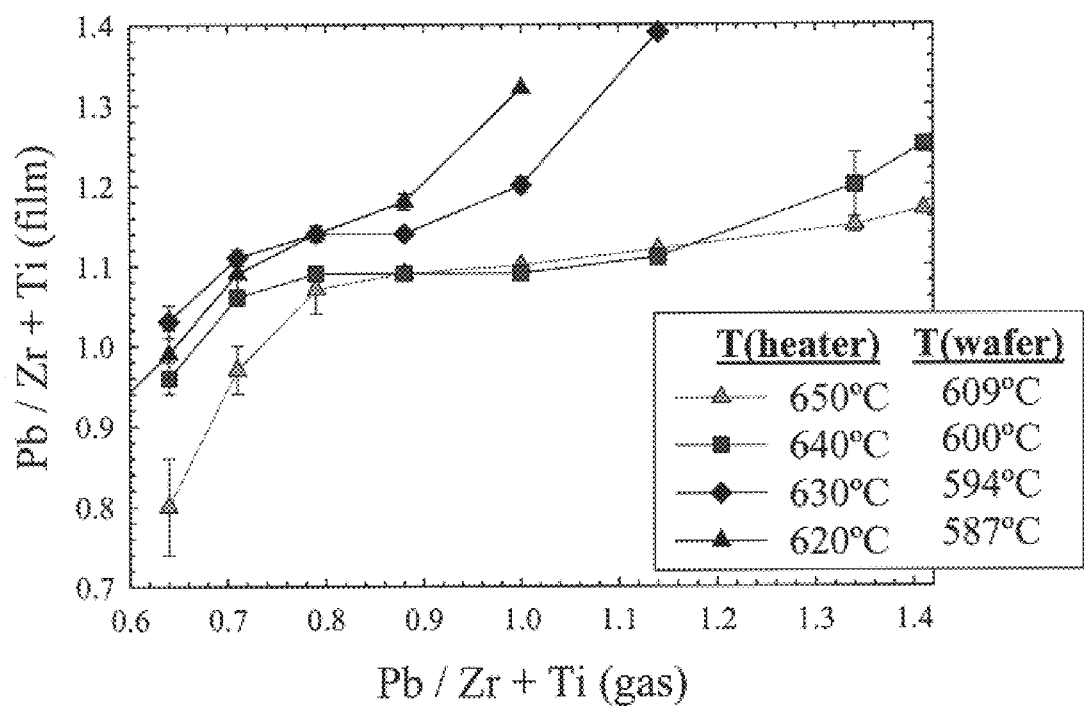

In addition to the preferred process described above, lower temperature processes may also be used for the PZT deposition step. Reducing the overall thermal budget simplifies capacitor integration, and depositing the PZT film is typically the highest temperature step. FIG. 9 shows the effect of reduced temperature on the size of the self-correcting Pb composition regime for the standard process conditions given in Table PZT1. It is evident in FIG. 9 that the size of the self-correcting plateau decreases significantly as the temperature is reduced. The PZT films also become increasingly rough at low temperature. For a wafer temperature of about 587° C. (heater set point of about 620° C.), the self-correcting behavior is no longer observed when the standard process conditions are used. As mentioned above, a self-correcting plateau is needed in order to obtain high quality PZT films and a robust process.

To reduce the deposition temperature and maintain a large self-correcting plateau, the process pressure is reduced from about 4 Torr to about 2 Torr and N$_2$O is added to the conventional O$_2$ oxidizer gas stream (total oxidizer flow is kept constant). As shown in FIG. 10, for a wafer heater temperature of about 630° C., reduced pressure combined with N$_2$O+O$_2$ gas flow significantly increases the size of self-correcting plateau region relative to the standard process. A similar effect is shown in FIG. 11 for a wafer heater temperature of 620° C. A range of pressures (1 to 10 Torr) and N$_2$O additions (10% to 100%) may be used for the low temperature deposition processes. Two exemplary processes are described in Tables PZT3 and PZT4, and these processes provide the results shown in FIGS. 10 and 11, respectively. Using this approach, the wafer heater temperature can be reduced from about 640° C. to about 620° C., with a corresponding reduction in wafer temperature from about 600° C. to about 575° C.

TABLE PZT3

Low temperature CVD PZT process #1.

| | |
|---|---|
| Heater Temperature | 630° C. |
| Wafer Temperature | ~586° C. |
| Pre-Deposition Time on Chuck | 30 sec on-pins / 60 sec on-heater |
| He B Carrier Flow Through Vaporizer #1 | 250 sccm |
| He B Carrier Flow Through Vaporizer #2 | 250 sccm |
| Oxygen Flow | 500 sccm |
| N$_2$O Flow | 500 sccm |
| Ar Purge Flow | 250 sccm |
| Ar Push Gas Pressure on Precursor Ampoules | 60 psi |
| Vaporizer Temperature | 190° C. |
| Jackets / Lid / Feedthrough Temperatures | 190° C. |
| Showerhead to Heater Spacing | 350 mils |
| Chamber Pressure | 2 Torr |
| Precursor #1 Flow (PZTG-2103) | 82 to 115 mg/min |
| Precursor #2 Flow (PZTG-2104) | 85 to 118 mg/min |
| Total Precursor Flow | 200 mg/min |
| Pb/(Zr+Ti) (in liquid) | 0.79 to 1.00 |
| Zr/(Zr+Ti) (in liquid) | 0.40 |
| Deposition Rate | ~107 Å/min |
| Substrate | Ir (100 nm) / Si$_3$N$_4$ / SiO$_2$ / Si and IrO$_x$ (50 nm) / Ir (50 nm) / Si$_3$N$_4$ / SiO$_2$ / Si |

TABLE PZT4

Low temperature CVD PZT process #2.

| | |
|---|---|
| Heater Temperature | 620° C. |
| Wafer Temperature | ~575° C. |
| Pre-Deposition Time on Chuck | 30 sec on-pins / 60 sec on-heater |
| He B Carrier Flow Through Vaporizer #1 | 250 sccm |
| He B Carrier Flow Through Vaporizer #2 | 250 sccm |
| Oxygen Flow | 250 sccm |
| N$_2$O Flow | 750 sccm |
| Ar Purge Flow | 250 sccm |
| Ar Push Gas Pressure on Precursor Ampoules | 60 psi |
| Vaporizer Temperature | 190° C. |
| Jackets I Lid / Feedthrough Temperatures | 190° C. |
| Showerhead to Heater Spacing | 350 mils |
| Chamber Pressure | 2 Torr |
| Precursor #1 Flow (PZTG-2103) | 82 to 115 mg/min |
| Precursor #2 Flow (PZTG-2104) | 85 to 118 mg/min |
| Total Precursor Flow | 200 mg/min |
| Pd/(Zr+Ti) (in liquid) | 0.79 to 1.00 |
| Zr/(Zr+Ti) (in liquid) | 0.40 |
| Deposition Rate | ~96 Å/min |
| Substrate | Ir (100 nm) / Si$_3$N$_4$ / SiO$_2$ / Si and IrO$_x$ (50 nm) / Ir (50 nm) / Si$_3$N$_4$ / SiO$_2$ / Si |

Deposition of the Ferroelectric Stack: Top Electrode

The top electrode 128, 130 is formed on the capacitor dielectric 126, as illustrated at 210 of FIG. 4. In this embodiment of the instant invention, the top electrode is comprised of two layers 128, 130, however, the top electrode can be implemented in just one layer. Preferably, the layer next to the PZT dielectric is comprised of iridium oxide (preferably less than 100 nm thick—more preferably less than 50 nm thick and even more preferably less than 30 nm thick). Preferably, the layer between the conductive oxide and top electrode diffusion barrier/hard mask is comprised of iridium (preferably less than 100 nm thick—more preferably less than 50 nm thick and even more preferably less than 20 nm thick).

In particular it is advantageous for Pb based ferroelectrics to have a conductive oxide top electrode such as IrO$_x$, RuO$_x$, RhO$_x$, PdO$_x$, PtO$_x$, AgO$_x$, (Ba,Sr)RuO$_3$, LaSrCoO$_3$, LaNiO$_3$, YBa$_2$Cu$_3$O$_{7-x}$ rather than a noble metal in order to minimize degradation due to many opposite state write/read operations (fatigue). Many of the Bi ferroelectrics such as SBT can also use noble metal electrodes such as Pt, Pd, Au, Ag, Ir, Rh, and Ru and still retain good fatigue characteristics.

If the top electrode is an oxide it is advantageous to have a noble metal layer above it in order to maintain low contact resistance between the top metal contact and oxide. For example, it is possible that a TiN in contact with IrOx might form TiO2 during subsequent thermal processes which is insulating. For any electrode using an expensive noble metal such as Pt, Ru, Pd, or Ir it is advantageous from a cost and integration standpoint to use as thin of layer as possible.

For PZT electrodes (electrodes bounding a PZT dielectric), the preferred top electrode stack is ~20 nm Ir (130) deposited by PVD in Ar on ~30 nm IrOx (128) deposited by reactive PVD in Ar+O$_2$ on top of the PZT 126. IrOx is preferred to be deposited ~500° C. in gas mixtures between 30% and 50% O2 with the rest oxygen with a relatively low sputter power and hence slow deposition rate (preferred to be less than 20 nm/min).

Deposition of the Ferroelectric Stack: Hard Mask

Preferably, the entire capacitor stack (220 of FIG. 5) is patterned and etched at one time (preferably using a different etchant for some of the layers), but each layer or grouping of layers alternatively may be etched prior to the formation of the subsequent layer or layers. If multiple layers or all of the layers are etched simultaneously, then a hard mask layer (e.g., 132 of FIG. 3) is formed over the stack at 212 of FIG. 4. Preferably, the hard mask is thick enough and comprised of a material so as to retain its integrity during the etch process.

It is preferred that the capacitor be completely enclosed by conductive top and bottom diffusion barriers and an insulating sidewall diffusion barrier. In some integration approaches it is preferred to have a conductive diffusion barrier remain on top of the capacitor after etching the entire capacitor. In all cases it is preferred to have a capacitor as short as possible for ease of integration.

Prior art hard masks 132 are composed of a single layer of material, typically a TiN layer or a TiAlN layer, which in some cases has been left on top of the FeRAM capacitor stack after definition thereof for subsequent use as a hydrogen barrier. Unfortunately, since a bottom electrode diffusion barrier layer 122 may also be made of the same material, a substantial portion of the hard mask 132 will be removed during the etch of the bottom electrode diffusion barrier layer 122, as illustrated in FIGS. 12 and 13.

Figure 12:
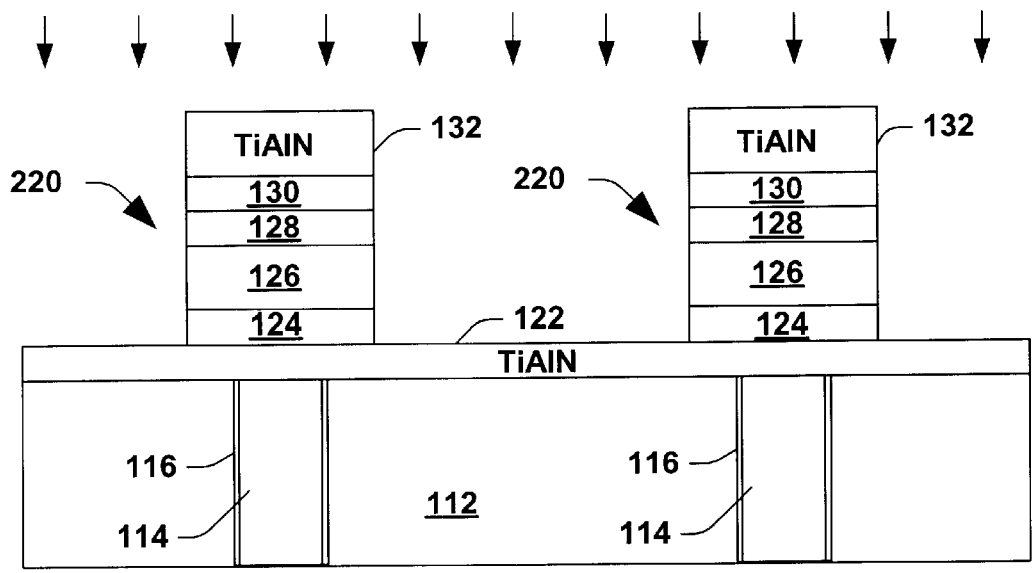
FIGS. 12 and 13 are fragmentary cross section diagrams illustrating how an etch of the bottom electrode diffusion barrier layer causes a rounding of the hard mask layer which may cause a contamination of a top electrode layer.
Figure 13:
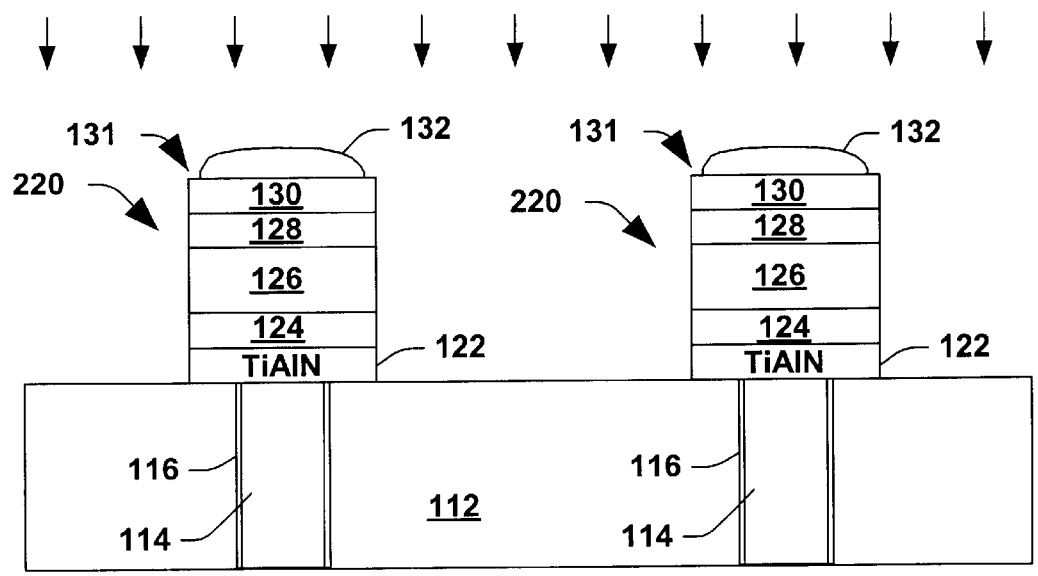

Note that in FIG. 12, the hard mask 132 and the bottom electrode diffusion barrier 122 are the same material (e.g., TiAlN). Since the barrier 122 is electrically conductive, the barrier must be removed in order to electrically isolate neighboring FeRAM cells from one another. As the barrier layer 122 is etched, the hard mask 132 etches at the same rate, thereby causing a substantial reduction of the hard mask thickness and a substantial rounding at the corners 131, as illustrated in FIG. 13. Such corner rounding can lead to an exposure of the top electrode 130 (e.g., an iridium layer) at the corners 131 which is undesirable for several reasons. First, such exposure may cause the top electrode 130 to contaminate production tools during subsequent processing; in addition, since the exposed electrode 130 is not an effective hydrogen diffusion barrier, the ferroelectric dielectric material 126 may experience hydrogen contamination (for reasons described in greater detail below) which may degrade substantially the FeRAM performance.

One prior art solution is to further increase the thickness of the hard mask 132 to compensate for such loss during etch of the bottom electrode diffusion barrier 122. Such a solution, however, undesirably increases the overall height of the FeRAM capacitor. In addition, through experiments it has been found that even with such compensation, a side portion of the underlying top electrode 130 (e.g., an iridium electrode) may still be subsequently exposed. Although a subsequent insulative barrier (e.g., an AlOx film, not shown) will be deposited over the capacitor stack, the insulative barrier is relatively thin and is intended as a sidewall barrier, and thus does not cover the exposed top electrode well after patterning thereof. Since the exposed portion of the top electrode 130 is not an effective barrier, the FeRAM is then negatively susceptible to hydrogen exposure, thereby degrading the performance thereof as described above.

In accordance with one aspect of the present invention, a multi-layer hard mask is disclosed in which a hard masking layer overlies an etch stop layer. The etch stop layer is substantially more selective than the overlying masking layer with respect to an etch employed to remove the bottom electrode diffusion barrier layer. Therefore during an etch of the capacitor stack, an etch of the bottom electrode diffusion barrier layer results in a substantially complete removal of the hard masking layer. However, due to the substantial selectivity (e.g., 10:1 or more) of the etch stop layer with respect to the overlying masking layer and bottom electrode diffusion barrier 122, the etch stop layer completely protects the underlying top electrode, thereby preventing exposure thereof. In addition, in accordance with another aspect of the present invention, the etch stop layer is electrically conductive and serves as a diffusion barrier, thereby eliminating a need for another diffusion barrier layer and reducing an overall height of the FeRAM capacitor stack.

Figure 14:
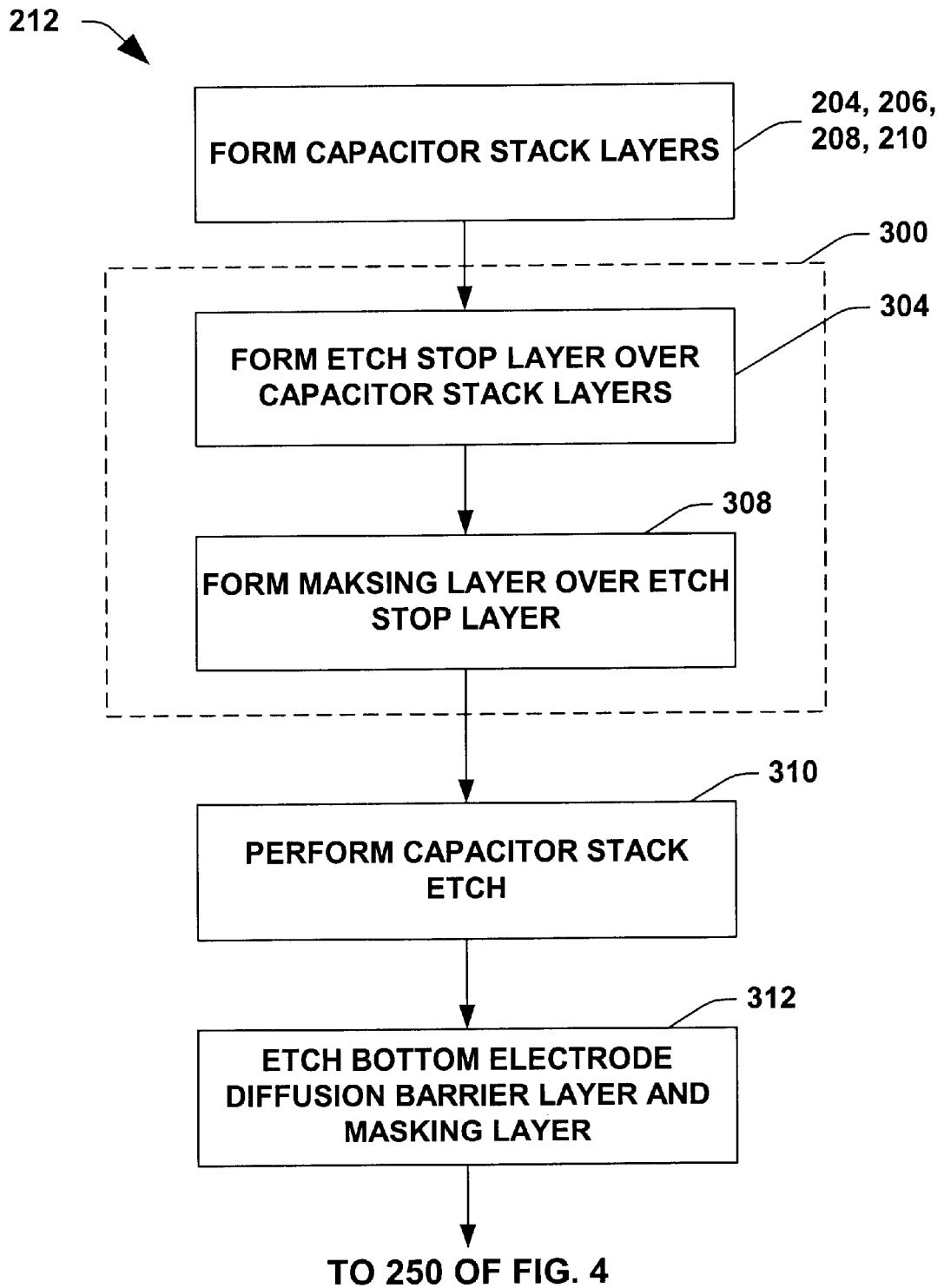
FIG. 14 is a flow chart diagram illustrating a method of forming a multi-layer hard mask layer in accordance with the present invention.
Figure 15A:
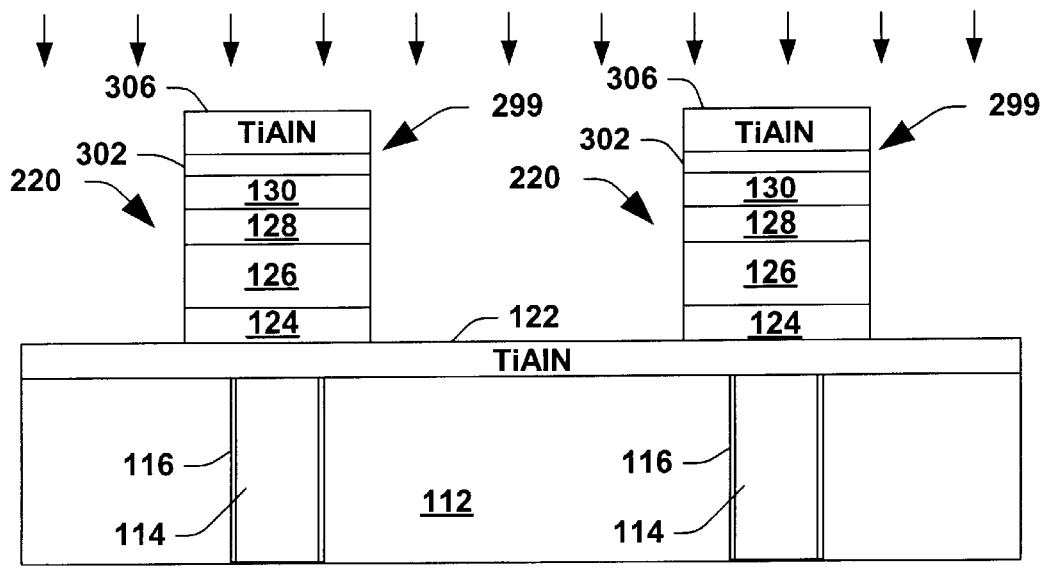
FIGS. 15a and 15b are fragmentary cross section diagrams illustrating steps in etching the bottom electrode diffusion barrier layer using a multi-layer hard mask according to the present invention.

In accordance with one aspect of the present invention, a method 212 (e.g., of FIG. 4) of forming an FeRAM using a multi-layer hard mask is illustrated in FIG. 14, and designated at reference numeral 212. Initially, the capacitor stack layers are formed at 204, 206, 208 and 210, as discussed previously, and comprise, for example, the bottom electrode layer(s) 124, the ferroelectric dielectric layer 126, and the top electrode layer(s) 128, 130. Subsequently, a multi-layer hard mask 299 is formed thereover at 300, for example, by forming an etch stop layer 302 at 304 of FIG. 14 followed by a masking layer 306 at 308, as illustrated in FIG. 15a. In accordance with one aspect of the present invention, the etch stop layer 302 comprises an electrically conductive material that has a substantially slower etch rate than the overlying masking layer 306 with respect to an etch chemistry employed to etch the bottom electrode diffusion barrier layer 122. For example, for a TiAlN masking layer 306, the etch stop layer 302 comprises a TiAlON layer with a substantial amount of oxygen therein, and the benefits of such an etch stop layer 302 will be apparent in the subsequent discussion of the method 212.

The method 212 then continues at 310, wherein a substantial portion of the capacitor stack is etched by patterning the multi-layer hard mask 299 and using the multi-layer hard mask to etch the underlying layers in the stack, for example, etching the top electrode layer(s) 128, 130, the ferroelectric layer 126, and the bottom electrode layer(s) 124. Note that the bottom electrode diffusion barrier layer 122 has still not been etched, and an etch of such layer must proceed since the layer is electrically conductive and thus the exposed portion must be removed in order to electrically isolate neighboring FeRAM capacitor stacks.

Figure 15B:
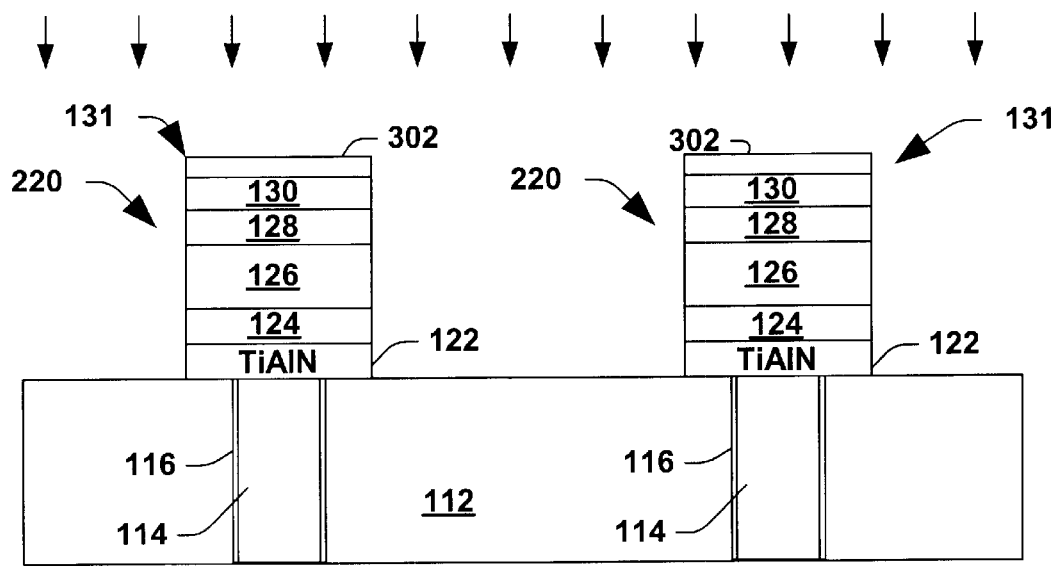

In accordance with the present invention, the bottom electrode diffusion barrier layer 122 has a composition substantially the same as the masking layer 306, for example, TiAlN. Therefore, as the method 212 proceeds to 312, an etch of the bottom electrode diffusion barrier layer 122 results in a substantial or complete removal of the masking layer 306 on top of the capacitor stack, as illustrated in FIG. 15b. In accordance with one exemplary aspect of the present invention, the masking layer 306 is sufficiently thin that an overetch of the barrier layer 122 results in substantially all of the masking layer 306 being removed, thereby exposing the underlying etch stop layer 302.

As discussed above, an etch rate of the etch stop layer 302 is substantially less than an etch rate of the overlying masking layer 306 during the patterning of the bottom electrode diffusion barrier layer 122. In the above manner, a substantial overetch of the barrier layer 122 may be performed without an exposure of the top electrode layer 130 (e.g., an iridium layer). In addition, by completely removing the overlying masking layer 306 off of the capacitor stack, the total height of the stack is reduced, which advantageously aids in subsequent integration steps.

In accordance with one exemplary aspect of the present invention, an etch of the TiAlN barrier layer 122 and the TiAlN masking layer 306 is performed using a chlorine etch chemistry. With such etch chemistry, an etch selectivity between the masking layer 306 and the underlying TiAlON etch stop layer 302 is about 10:1 or more. Therefore when etching the barrier layer 122, once the etch removes the masking layer 306 and reaches the etch stop layer 302 on top of the capacitor stack, the etch slows down substantially, thereby allowing a substantial overetch of the barrier layer 122. In addition, since the etch slows down substantially, the etch stop layer 302 completely protects the underlying top electrode layer 130, thereby preventing an exposure of a side portion 131 thereof, as illustrated in FIG. 15b. Thus, the etch stop layer 302 is all that remains of the multi-layer hard mask after the patterning of the bottom electrode diffusion barrier layer 122.

Therefore, in accordance with one aspect of the present invention, a multi-layer hard mask 299 and a method 212 of forming an FeRAM using such a multi-layer hard mask is disclosed. In such a solution, the hard mask 299 is composed of two or more layers (302, 306), wherein the top layer 306, the masking layer, acts as the hard mask and is removed as part of the capacitor stack etch process. The second, underlying layer 302, the etch stop layer, acts as the top electrode diffusion barrier and an etch stop during the capacitor stack etch. A third, optional layer (not shown) is an additional diffusion barrier, and may be located between the etch stop layer 302 and the underlying top electrode 130.

As discussed above, the top layer, the masking layer 306, may be the same material as the bottom electrode diffusion barrier layer, for example, TiAlN, however, such a solution is not required by the present invention. Rather, as long as the etch rate of the masking layer 306 is approximately the same rate as the bottom electrode diffusion barrier layer 122, any material may be employed and is contemplated as falling within the scope of the present invention. For example, one may use a conductive nitride, carbide or carbo nitride as the masking layer.

Similarly, although TiAlON is disclosed as one exemplary etch stop layer, it should be understood that any material that exhibits a high selectivity with respect to the bottom electrode diffusion barrier layer 122 (and the masking layer 306) may be employed and is contemplated by the present invention. For example, an oxygen doped material may be employed as the etch stop. An oxide is a good etch stop using the appropriate etch chemistries. It has been noted that $Cl_2+BCl_3$ chemistries with quickly etch both materials yet $Cl_2$ or $Cl_2+Ar$ chemistries only slowly etch the oxy-nitride films. Although adding oxygen to these materials will in general increase the resistivity, there is in general a window where the resistance is acceptable and where a large change in the etch characteristics can be obtained. An estimate of the maximum resistivity for the etch stop layer 302 is about 10 mΩ-cm.

In one example of the present invention, the multi-layer hard mask 299 is about 50 to 500 nm thick (more preferably around 100 to 300 nm thick—most preferably around 200 nm thick). The hard mask 299 thickness is controlled by the etch process and the relative etch rates of the various materials, the thicknesses of the etched layers, the amount of overetch required, and the desired remaining etch stop layer thickness after etching all of the layers. Thinner ferro stack layers can use thinner hard masks. The hard mask 299 may or may not be removed after the etching of the capacitor stack. If the hard mask 299 is not removed, then it is preferable to form the hard mask of a conductive material. However, a non-conductive or semiconductive material may be used, but the interconnection to the top electrode of the capacitor should preferably be formed through this hard mask so as to make direct connection to the top electrode.

In accordance with an alternative aspect of the present invention, a single layer, pure oxide hard mask etch stop that is insulating may be employed, but the etch process must then be adjusted in order to ensure that this layer is completely removed.

In accordance with one exemplary aspect of the present invention, the etch stop layer 302 also serves as the top electrode diffusion barrier layer and comprises TiAlON having a film thickness of about 20 nm or more and about 50 nm or less. In addition, the TiAlON has a composition of oxygen that maintains the resistivity of the layer to about 10 mΩ-cm or less. Alternatively, etch stop layer and the barrier layer may comprise separate layers, for example, a TiAlON etch stop layer having a thickness of about 15 nm or more and about 40 nm or less, with the etch stop layer overlying a TiAlN diffusion barrier layer (not shown) having a thickness of about 20 nm or more and about 40 nm or less.

In the preferred embodiment shown in FIG. 15a, the hard mask 299 comprises a TiAlN masking layer 306 having a thickness of about 200 nm on top of a TiAlON etch stop layer 302 having a thickness of about 30 nm and a composition of about O 0.6, N 0.4. In addition, a separate barrier layer (not shown) may comprise a TiAlN layer having a thickness of about 30 nm.

In alternative preferred embodiment, the hard mask 299 is further simplified to two layers of TiAlN layer of about 200 nm thick on top of a hard mask etch stop layer of TiAlON (composition (O 0.6 N 0.4)) and about 40 nm thick where the TiAlON layer acts both as hard mask etch stop and also as conductive hydrogen diffusion barrier.

In another alternative aspect of the present invention, one may employ TiN and TiON as the masking layer and the etch stop layer/barrier layer, respectively. These materials are advantageously because the materials are relatively simple to deposit, have a low resistivity. In particular, the resistivity of TiO is not much higher than TiN and because of the higher oxygen it creates an excellent etch stop.

Contamination Control—Cleaning the Backside of the Wafer

After the contact formation several different deposition steps have been described. In particular, the formation of the bottom diffusion barrier 122, bottom electrode 124, ferroelectric 126, top electrode 128, 130 and hard mask 132, 299. It is likely that all or nearly all of these pieces of equipment will be considered potentially contaminated by ferroelectric elements. Therefore these pieces of equipment may be considered dedicated. The wafers will most likely have a reasonable, if not a high contamination level on the backside of the wafers. The next process step after hard mask deposition is typically lithography. It is likely that processing wafers with backside contamination through this tool will contaminate the tool and hence result in contamination of clean wafers processed through this tool with FeRAM contaminants on their backside. Therefore it is preferred to clean the backsides of the FeRAM wafers in order to share the lithography equipment and allow clean wafers to be processed through the lithography equipment and not have any FeRAM contamination. The clean process depends on the backside contamination elements and their contamination levels. Assuming the preferred approach (PVD barrier, hard mask, bottom electrode, top electrode and MOCVD PZT) there will be low levels of Ir on the backside, but continuous films assuming the MOCVD process does not have edge exclusion. Therefore for this type of wafer contamination the preferred backside wafer clean process is a wet etch process that etches the back, edges and small region on the front side of the wafer near the edge. The etch process is somewhat dependent on the materials present on the backside of the wafer (for example if it is Si, $SiO_2$ or $Si_3N_4$). As discussed earlier it is preferred to have SiN present on the wafer backside because very aggressive chemicals can be used to etch any ferro contamination while minimizing the amount of SiN etched. An example of an aggressive chemical is hot 80° C. concentrated HF or a bath chemistry that combines hot aqua regia ($HCl+HNO_3$) or $SC_2$ ($HCl+H_2O_2$) with HF. Instead of using peroxide dissolved ozone can be used and can be even more effective. The SiN also has a slow diffusion rate of these materials and hence only a small amount of SiN needs to be removed in order to have surfaces so clean that there are no detectable levels of ferro elements.

Ferro Capacitor Lithography

It is preferred to perform pattern and etch the capacitor stack with only one lithography step. This is not only cheaper but also allows the cell size to be smaller by eliminating misalignment tolerances which are necessary if more than one lithography step is used.

It is preferred that patterning process is by lithography and the type of lithography is dependent on the desired size of the feature size plus the misalignment to underlying layer (CONT in this example). In this particular example, the lithography was performed using DUV (248 nm) lithography process using organic BARC and relatively thin resist. Larger features could use i-line or even g-line features while even smaller features would require even smaller wavelengths 193 nm or 157 nm. Instead of an organic BARC an inorganic BARC could also be used and this might be incorporated into the hard mask etch process. The resist thickness is chosen such that it can hold up during the hard mask etch process. In this example the resist was 510 nm thick while the hard mask was 260 nm thick, the BARC thickness was 60 nm and 248 nm lithography was used to pattern capacitors ~250–600 nm in size with a gap spacing of 180 to 300 nm narrow space between the capacitors. Wider spaces were also printed depending on cell size and shape.

Etching the Ferroelectric Stack—Hard Mask Etch, Ash, Clean

As mentioned before the preferred approach is to use a hard mask with multiple etch processes. These etch process can be modified by using elevated temperatures in order to achieve even steeper sidewall slopes and therefore less CD growth. In general it is preferred to minimize CD growth and this can be achieved by having steeper etch profile or by having thinner layers.

The first step is etching the hard mask and any BARC at 212 of FIG. 4 (inorganic or organic) that might be used followed by clean/ash processes. In this preferred embodiment the BARC/hard mask is preferably etched in the same chamber using a one or more step etch recipe. In general, the preferred etch system is has a high density plasma. In this example, two steps are used. The BARC etch consisted of $Cl_2+O_2$ at low pressures (3 mTorr) at temperatures low enough not to damage the resist (60° C.) with high density plasma (300W RF source power) and small bias (50W RF on the chuck). An example of a tool of this type is the AMAT DPS etch tool. After a short gas purge step the multi-layer Ti containing hard mask stack is etched in $Cl_2+BCl_3$ gas chemistry ($BCl_3$ substantially helps etching of O containing compounds present as crust on surface or as in this example O containing layers) at same temperature as BARC etch (60° C.) at low pressure (5 mTorr) and high plasma density (1400W source power) and still low bias (100W RF on chuck). The exact process is adjusted to minimize CD growth, maximize uniformity and repeatability of etch process while trying to minimize hard mask thickness.

After the hard mask is etched it is necessary to ash the resist and if the resist process leaves a residue, a clean is sometimes used (either before or after the ash) in order to remove this residue. The ash process can be performed either in a separate chamber/process tool, in situ in the hard mask etch tool or in situ in the ferro stack etch chamber. The clean can either be wet or dry and might be something as simple as DI dunk/rinse or possibly use more active chemicals such as solvent (EKC for example). The goal of the clean is to remove particles and residue. In this specific example, an $O_2$ ash step (alternatively $O_2+H_2O$ or even fluorine containing compounds could be used) at elevated temperatures in order to enhance the ash rate (250° C.) using high plasma density, but low energy and little if any substrate bias (AMAT ASP chamber, for example). In order to try to remove the need for a wet clean process a more aggressive ash process can be used such as adding fluorine compounds such as $CF_4$ to the ash process and adding a small amount of substrate bias.

In accordance with one aspect of the present invention, an NH4OH:H2O2:H2O solution is employed with a spray tool. Such a solution used with a spray tool was found to give improved cleaning compared to a bath operation using the same solution.

Etching the Ferroelectric Stack—Top Electrode, Ferroelectric and Bottom Electrode In general it is preferred to etch as many layers in the same chamber as possible. Since the top electrode and bottom electrode are typically hard to etch materials and usually very similar materials there is a strong preference to etch this ferro stack (top electrode, ferroelectric and bottom electrode) in the same etch chamber. The following discussion assumes that one etch chamber is used to etch this ferro stack at 212 of FIG. 4 because that is preferred, but it is also possible to use multiple chambers which has the advantage that each chamber can be optimized for each process.

The top electrode 128, 130 is etched after patterning the hard mask. In order to etch noble metal top electrodes (preferably Ir/IrOx) a high temperature etch process is used because this is typically needed in order to achieve a chemical etch. The chemical etch has the advantage that steeper sidewall profiles can be achieved with usually less CD growth and better etch selectivity to other layers such as the hard mask. One exemplary etch chemistry for these noble metal electrodes is $Cl_2+O_2$ or $Cl_2+CO$. Other gas additives such as $N_2$ or Ar can also be added although Ar in particular is usually not a good choice because it only etches by physical mechanisms and not chemical. An exemplary process is sensitive to electrode and hard mask material. In this exemplary embodiment the top electrode etch is $Cl_2+O_2+N_2$. For Ti containing hard masks the oxygen content of the top electrode etch preferably is >5–10% in order to achieve a very low hard mask etch rate (e.g., good selectivity to the hard mask). The optimum etch process uses a high density plasma (1200W, for example) and an intermediate substrate bias (300W chuck) at intermediate pressures (10 mTorr) and elevated temperatures (350–400° C.). This type of process results in etch rates in the range of about 80 nm/min.

In general there is a tradeoff between physical etching using a larger substrate bias (lower pressure or higher chuck power) with the advantage of a faster etch rate and chemical etching which in general has the advantage of a steeper capacitor profile, less CD growth and better selectivity to the hard mask. The gas composition can be optimized to provide the maximum chemical etch rate or the maximum ratio of chemical etch rate to physical etch rate. This difference can be estimated by measuring etch rate as a function of temperature and physical etch rate is temperature independent while the chemical etch rate varies with temperature. A rough estimate of this maximum chemical etch component based on gas composition (varies depending on details of process) is roughly 30–80% $O_2$ or CO for $Cl_2+O_2$ and $Cl_2+CO$, respectively. Another important aspect of the etch process is the time between cleans.

One reason to maximize the chemical nature of the etch process is in reducing CD growth. When using these Ti containing hard masks and O containing etch chemistries it has been determined that Ti etched from the edges of the hard mask by physical etching can redeposit on the sides of neighboring capacitors resulting in deposition of oxygen containing material that causes CD growth of the capacitor. The physical etching causes the formation of facets on the sides of the capacitor. In general, larger facet formation results in larger CD growth and larger CD growth is correlated to larger facet formation.

Etching these materials in general results in re-deposition of noble electrode and other low vapor pressure materials on the walls of the etch chamber. These layers can cause problems such as particle generation or variation in the etch process. Therefore the time between cleans indicates the number of wafers that can be etched before one of these problems becomes severe enough that the chamber has to be cleaned and conditioned for further etching. It has been found that this time between cleans can be impacted by the choice of etch chemistry plus many other factors including preconditioning, choice of wall materials and temperature plus details of the physical design of the etch tool itself for example.

Etching the ferroelectric 126 requires choosing an etch process that is again compatible with the choice of hard mask. For a PZT ferroelectric material, multiple etch approaches will be discussed.

The first exemplary approach uses a modification of the hard mask etch based on a $Cl_2$+Fluorine gas+oxidizer ($O_2$ or CO for example) with Ar or $N_2$ possibly added as well. For high temperature etching the fluorine gas prevents chemical undercut of the PZT. It turns out that fluorine gas at an elevated substrate temperature (350° C., for example) can chemically etch at least part of the PZT. Using fluorine containing gases that also contain hydrogen helps reduce this effect, for example $CF_4>CHF_3>CH_2F_2>CH_3F$. An exemplary etch condition using this etch approach is $Cl_2+O_2+CH_2F_2$ (75/35/12) at high chuck temperature (350° C.–400° C.) at medium pressure (10 mTorr) at high density plasma (1200W) and large substrate bias (450W RF on chuck). These types of processes result in etch rates in the range of 70 nm/min. If the ferroelectric film is rough a large overetch is in general needed.

In analyzing the above PZT etch that contain fluorine components, the inventors of the present invention discovered problems with the etched PZT layer. In particular, it was noted that various defects were identified in the PZT layer, for example, void or gaps therein, in some cases as large as 1 µm or more. In addition, some spacing or delamination could periodically be identified between the PZT layer and the underlying bottom electrode layer. Such defects are undesirable because they may result in degraded polarization properties, for example, the switch polarization. It is believed that the cause of such film degradation is the fluorine component(s) within the PZT etch chemistry. More particularly, it is believed that fluorine is selectively chemically attacking elemental portions of the PZT within the film as opposed merely to its exposed sidewall edges of the stack. For example, from a thermodynamics point of view, when fluorine is exposed to zirconium oxide, it reacts to form zirconium fluoride and oxygen since that result is energetically preferred.

Therefore the inventors of the present invention determined that the fluorine component of the PZT etch should be eliminated to avoid the PZT degradation highlighted above. In accordance with one aspect of the present invention, the PZT portion of the capacitor stack etch employs $BCl_3$ as opposed to an etch chemistry containing a fluorine component. The use of $BCl_3$ as an etchant for the PZT is not an obvious substitution from the prior art etch chemistry for at least the following reasons. Initially, $BCl_3$ does not appear viable because such an etch provides poor selectivity with respect to the hard mask (e.g., a TiAlN hard mask), thereby resulting in substantial hard mask erosion. One conventional way to improve the selectivity of a layer with respect to the hard mask is to add oxygen, however, $BCl_3$ is extremely reactive; so much so that the boron and chlorine may disassociate due to the oxygen and negatively form gas phase particles. Therefore initially one of ordinary skill in the art would not be motivated to use a $BCl_3$ etch chemistry to etch the PZT.

The inventors of the present invention discovered that at low chuck temperatures, if you lower the bias, the hard mask erosion due to the $BCl_3$ slows, but the PZT etch rate also slows. Surprisingly, however, it was discovered that while the low bias was maintained, if the chuck temperature was increased, the PZT etch rate increased substantially without any substantial change in the hard mask etch rate. Therefore at a generally low bias of about 100–150W, a high temperature $BCl_3$ etch will provide an effective etch of PZT with acceptable selectivity to the hard mask without any introduction of oxygen. Generally a temperature of about 150° C. or more is acceptable and preferably a temperature of about 350° C. is employed.

In addition, it was found that at lower temperatures, for example, about 150° C., a higher bias was needed to etch the PZT (e.g., about 250W), however, the lower the temperature, the poorer the selectivity is to the hard mask. As the temperature was increased, the bias could be lowered and higher selectivities were obtained. For example, at a temperature of about 350° C., a bias of about 100–150W was employed and excellent selectivity to the hard mask was obtained.

Further, it was found by the inventors of the present invention that adding Ar to the $BCl_3$ during the PZT etch could be employed to an advantage. For example, at lower temperatures (e.g., around 150° C.), only enough Ar to generate and maintain the plasma is used. For example, the ratio of Ar to $BCl_3$ in such an example is about 20–30% Ar. At higher temperatures, for example, about 350° C., a ratio of about 50/50 facilitates hard mask selectivity.

Therefore according to one aspect of the present invention, a PZT etch approach uses a $BCl_3$ etch chemistry which may further include Ar. The $BCl_3$ etch chemistry is effective in etching oxide materials because the B reacts with the oxygen in the oxide forming BOx which is etched by Cl. The metals in the oxide can then easily react with $Cl_2$ forming volatile compounds. For Ti containing hard masks, the optimum hard mask for purposes of selectivity is a nitride (e.g., TiAlN) because the B reacts with the nitride to form a BN layer which slows the etch rate.

One issue with using this etch chemistry with oxygen containing chemistries in preceding or subsequent etch steps is to ensure that there is a purge step between these steps in order to prevent the oxygen from those etch chemistries from reacting with the $BCl_3$. Because of the reactive nature of this etch gas, low substrate biases can be used (100–200W RF on the chuck) along with possibility of higher pressures (10–30 mTorr). Etch rates of 50–100 nm/min are achievable with these type of conditions. These low biases also result in less physical etching of the hard mask although if a surface layer of oxide is on the Ti hard mask due to reaction from the oxygen in the top electrode etch it will be removed.

As discussed above, use of a $BCl_3$ etch for the PZT etch results in a capacitor stack etch of, for example, Ir/PZT/Ir using $Cl_2+O_2+N_2$ for the top/bottom electrodes and $BCl_3$+Ar for the PZT with each etch performed at a relatively high temperature (e.g., about 350° C.). The above etch methodology allows for a quality PZT layer without any substantial gap or void degradation. Upon evaluating the resulting etched FeRAM capacitor stack, however, it was noticed that conductive material in some cases would tend to form on side edges of the ferroelectric PZT layer. It is believed that such conductive material comprises etched iridium that re-deposits on the sidewall of the PZT during the etch of the iridium bottom electrode layer. Further, upon analysis, it was appreciated by the inventors of the present invention that such re-deposition of iridium on the PZT sidewall edges occurs because of the substantially vertical PZT sidewall.

The $BCl_3$ PZT etch results in a substantially vertical sidewall having an angle of about 89 degrees or more. Generally, such a vertical profile is considered highly desirable in order to minimize the critical dimension (CD) of the FeRAM capacitor. It was discovered, however, that with such a steep profile, when iridium from the etched bottom electrode layer re-deposits on the PZT sidewall, less ion impingement occurs thereon. Therefore due to the steep PZT sidewall profile caused by the $BCl_3$ PZT etch, re-deposited iridium does not tend to be removed by ion impingement during the bottom electrode etch. Since the re-deposited iridium is electrically conductive, such re-deposition disadvantageously results in capacitor leakage and in some cases a "shorting out" of the FeRAM capacitor.

It was discovered by the inventors of the present invention that by lowering the etch temperature during the PZT etch, a slightly sloped or non-vertical PZT sidewall edge profile may be obtained. At low etch temperatures (e.g., about 60° C.), however, $BCl_3$ does not etch well because of poor selectivity to the hard mask, and because the etch is extremely slow, and in some cases may completely stop.

The inventors of the present invention therefore appreciated that a PZT etch that generates an intentionally sloped or non-vertical PZT sidewall profile provides for a resulting stack without substantial leakage or potential shorted capacitor problems. Introducing an intentional sloped PZT sidewall profile in the capacitor stack is counter-intuitive because generally attempts are made to achieve purely vertical sidewalls to minimize the capacitor critical dimension. According to one aspect of the present invention, a sloped PZT profile having a sidewall angle of about 88 degrees or less is generated using a low temperature etch process (e.g., about 60° C.) using a fluorine gas+$Cl_2$+an oxidizer, for example. Therefore in accordance with the present example, the capacitor stack process comprises a high temperature etch for the top electrode, a low temperature etch for the PZT, and a high temperature etch for the bottom electrode. Such a process can be employed in a single etch tool using two separate chambers associated therewith, wherein the top and bottom electrode etches are performed in one of the chambers at the high temperature (e.g., about 350° C.), and transferred to and from a second chamber in which the PZT layer etch is performed at a lower temperature (e.g., 60° C.).

As discussed above, the $BCl_3$ PZT etch does not work well at low temperatures, however, the inventors of the present invention discovered that by using a fluorine gas+$Cl_2$+an oxidizer with Ar or $N_2$ at low temperatures, a sloped PZT profile having an angle of about 88 degrees or less could be achieved. More particularly, in one example, $CHF_3+Cl_2+O_2+N_2$ was used at a temperature of about 60° C. on chuck. Unexpectedly, unlike at high temperatures (as discussed earlier), such an etch chemistry does not cause voids or gaps in the PZT and thus a sloped PZT sidewall profile is obtained without PZT film degradation.

In accordance with one aspect of the present invention, a PZT sloped profile has an angle of about 80 degrees or more and about 88 degrees or less. In the above manner, the slope is sufficiently angled to allow ion impingement (e.g., chlorine ions) to remove re-deposited iridium on the PZT sidewall (during bottom electrode etch) at a faster rate than the deposition. Concurrently, by preventing the angle from becoming too small, critical dimension growth is minimized.

After removal of the PZT layer, the bottom electrode layer is patterned. Etching the bottom electrode 124 typically uses an etch process very similar to the top electrode etch process if the electrode materials are similar as is the situation in this preferred embodiment. Note that with a Ti hard mask the bottom electrode etch will effectively stop on the bottom electrode diffusion barrier 122 (TiAlON, TiAlN or TiON in this example). This is an advantage of this approach because it allows large overetch to be used without the formation of undesirable recesses or notching next to ferro structures because of overetch.

After etching the bottom electrode 124, one option is to perform an oxygen anneal in order to replace any oxygen that might have been removed by the etch process. One way to perform this anneal is an in-situ $O_2$ plasma (1000W) with minimal (25W chuck) at 20 mTorr in the high-T etch chamber or possibly run the wafers through a standard ash process (250° C.). The ash process could be $O_2$ or possibly $O_2+H_2O$ combination.

In general, the various etch steps are end pointed using optical emission spectroscopy, substrate bias changes, or some other technique such as RGA or optical techniques that look at the wafer surface. Depending on the details of the etch process, roughness of the layers being etched and the shapes and especially spaces in the structures being etched it is typically necessary to set larger overetch times than might be expected based on endpoint traces. This is because the etch rate in narrow spaces is slower than in tight spaces plus rough films like frequently found with MOCVD PZT need more etch time in order to clear. Another reason to increase the overetch time is to remove "feet" that are present for some processes at the bottom of the ferro stack.

Post Etch Clean (Front and Backside)

The etch process is a dirty process and hence it is likely that the etch tool and the front side, edge and backside of the wafers will have FeRAM contamination or have etch residues with FeRAM contamination. It is therefore desirable to clean the front side of the wafer and chemically remove etch residues and possibly remove a thin layer of damaged PZT. This post capacitor etch wet clean can with some etch conditions and chemistries, be as simple as a DI water clean (tank soak with or without megasonic followed by a spin rinse dry) or the tank etch might be acid based in order to improve the clean or remove more damage. One exemplary acid solution might be similar to SC1 or SC2 (possibly without peroxide but maybe with ozone), for example ($NH_4F+O_3+H_2O$ or $NH_4F+H_2O_2+HCl+H_2O$: 1/1/1/300) in order to also assist in particle removal plus metal contamination removal).

The backside and edges of the wafer are likely to be significantly contaminated by re-deposition of FeRAM elements. The contamination is preferably removed prior to processing in a shared tool.

One method to remove the backside chemistry is to use a specialized tool such as a backside clean tool (e.g., as made by SEZ). Even hard to etch materials such as Ir can be removed if they are sub monolayer coverage by undercutting the etching of the material on the backside. Processes as described previously can be used here.

Use of wet etch cleans to remove damage on the sidewalls of the etched PZT due to etch damage will work fairly well if such damage is close to the sidewall surface, for example, within about 10 Angstroms of depth. In such instances, a wet clean may be employed to remove the damaged PZT material. However, if etch damage is substantially deeper, for example, about 100–300 Angstroms, a wet etch removal of such damage can in some instances alter the microstructure of the PZT and create voids or gaps therein. In addition, even without microstructure changes, a removal of a substantial amount of damaged PZT will result in a substantial undercut of the PZT between the top and bottom electrodes. Such undercut may cause subsequent integration problems with regards to a sidewall hydrogen diffusion barrier. More particularly, with a substantial PZT undercut, the coverage of a sidewall barrier (e.g., AlOx) may be poor and/or inadequate, and potentially degrade the protection of the PZT from hydrogen contamination.

In addition, while a wet etch clean procedure may remove PZT etch damage, it has been discovered by the inventors of the present invention that a high temperature PZT etch such as a $BCl_3$ etch at about 350° C. can cause or otherwise generate point defects within the PZT layer. Point defects may be so small that they are not measurable via standard characterization methods, but may nevertheless have a substantial negative impact on the electrical behavior of the PZT. For example, point defects can impact the capacitor polarization performance or the polarization reliability in terms of cell fatigue or relaxation.

In light of the appreciation of the potential problems associated with wet etch clean methods that remove damaged PZT material and high temperature dry cleans fail to address point defect issues, one aspect of the present invention relates to a post etch clean or repair comprising an anneal of the capacitor stack. For example, the present invention contemplates performing an anneal at an elevated temperature with a lead overpressure to overcome the lead loss such as in point defects that may occur or be generated during the capacitor stack etch.

In accordance with one aspect of the present invention, the anneal occurs with the presence of oxygen and such oxygen does not adversely impact the FeRAM because of the existence of the bottom electrode diffusion barrier layer which has not yet been etched. Therefore the barrier prevents the oxygen from reacting with the underlying tungsten contacts and also shields the lead from reacting with the interlayer dielectric which may be $SiO_2$, and thus prevents the formation of a lead silicate.

The anneal is preferably performed at a temperature of about 450° C. or more and about 650° C. or less to accommodate the thermal budget of any CMOS logic that may be integrated with the FeRAM. More preferably, such an anneal is performed at about 650° C. for about 2 minutes. Such an anneal is performed within an anneal chamber (for example, a furnace) with the substrate containing the etched FeRAM capacitor stack facing a Pb (lead) compound target or source material such as PbO, $PbTiO_3$ or PZT.

In the present invention, a Pb overpressure within the anneal chamber means that the vapor pressure associated with the Pb source is greater than the vapor pressure of the etched PZT. Therefore the lead oxide from the source material will attempt to reach equilibrium with the lead oxide in the PZT, thus providing lead thereto to fill the point defects and repair other damage via vapor transport. According to one example, the vapor pressure of the Pb source material is maintained at about the vapor pressure associated with an optimal PZT composition (for example, an ideal PZT film) so that upon equilibrium, the etched PZT is substantially repaired.

In accordance with another aspect of the present invention, the anneal may be performed in a CVD chamber or furnace, wherein lead is introduced to the damaged PZT by flowing relatively low amounts of Pb metalorganic precursors with oxygen such that the Pb forms PbO but does not deposit as such on the wafer because its deposition rate is slower than its evaporation rate. In the above manner, the Pb activity of the etched PZT layer is exploited to coordinate a repair thereof.

Note that with an anneal repair, the PZT etch damage is addressed without requiring a removal of material on the PZT sidewall, thereby preventing damage to the PZT due to a wet etch as well as improving the subsequent sidewall diffusion barrier reliability. Further, the anneal of the present invention may also be followed by a de-ionized water rinse to remove any particulate contaminants that may be associated with the stack (for example, capacitor stack etch by-products).

Figure 16:
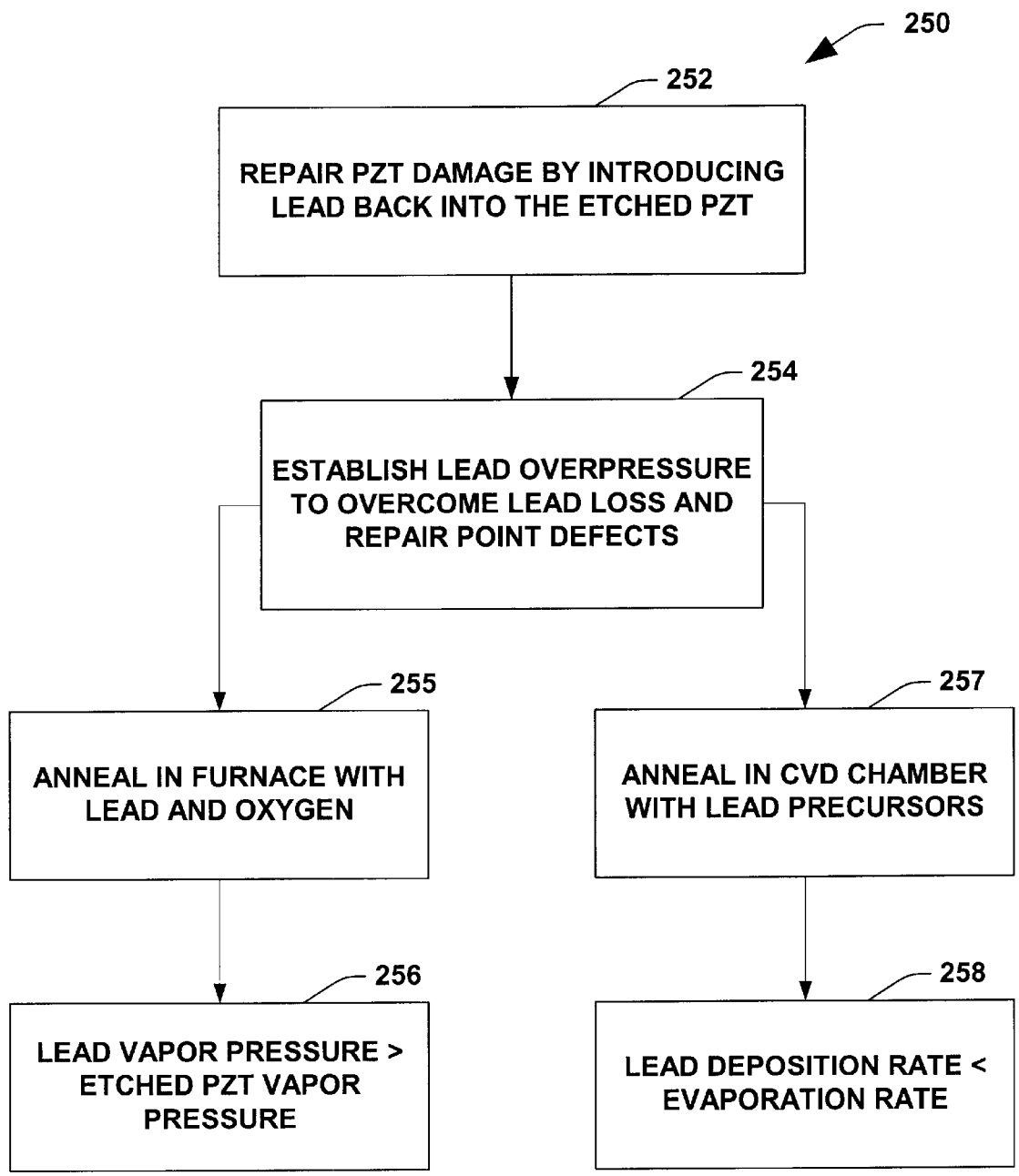
FIG. 16 is a flow chart illustrating a method of performing a post-capacitor stack etch repair/clean of the PZT ferroelectric layer according to the present invention.

Therefore in light of the above, a method 250 of performing a post-etch (capacitor stack etch) clean and/or repair of the PZT ferroelectric layer is disclosed in accordance with the present invention, as illustrated in FIGS. 4 and 16, respectively. The method 250 comprises repairing PZT damage due to the capacitor stack etch by introducing lead back into the PZT ferroelectric layer at 252. Such introduction is achieved by establishing a lead overpressure in a chamber during an anneal at 254. In one aspect of the present invention the anneal is performed in a furnace with lead and oxygen source materials therein at 255 with a lead vapor pressure established and/or maintained therein which is greater than the etched PZT vapor pressure at 256. In accordance with another aspect of the present invention, the anneal is performed in a CVD chamber with one or more lead precursors contained therein at 257, wherein the lead deposition rate is established to be less than the lead evaporation rate therein at 258. In the above manner, the present invention repairs defects, including point defects associated with the PZT ferroelectric layer etch damage in the capacitor stack etch.

Depositing the Sidewall Diffusion Barrier

As shown in the method of FIG. 4, once the post-etch clean 250 has been completed, an insulating sidewall diffusion barrier (typically AlOx) is deposited at 260 in order to protect the FeRAM capacitor from hydrogen contamination, and also to protect other structures from lead contamination if the ferroelectric dielectric is PZT. In prior art solutions, the sidewall diffusion barrier was formed over the capacitor stack after the bottom electrode diffusion barrier 122 was etched to electrically isolate neighboring capacitor stacks from one another. The inventors of the present invention discovered that such a solution was undesirable since some sidewall diffusion barrier layer materials (e.g., AlOx) are not substantially selective with respect to the underlying interlayer dielectric 112, typically $SiO_2$. Therefore, in prior art methods, when subsequently etching the sidewall diffusion barrier, the underlying $SiO_2$ layer would also be attacked. In addition, if either the hard mask (e.g., the etch stop layer 302) or the bottom electrode diffusion barrier layer comprise TiAlON, for example, and have sufficient oxygen content therein, the AlOx etch would also attack such layers and in some cases compromise the top/bottom barrier capability of such layers. Accordingly, the inventors of the present invention, appreciating the problems of the prior art, disclose a method of fabricating an FeRAM by forming the sidewall diffusion barrier layer over the capacitor stack before the etching of the bottom electrode diffusion barrier layer. Such a method results in several advantages could be achieved, as will be discussed in greater detail below.

Figure 17:
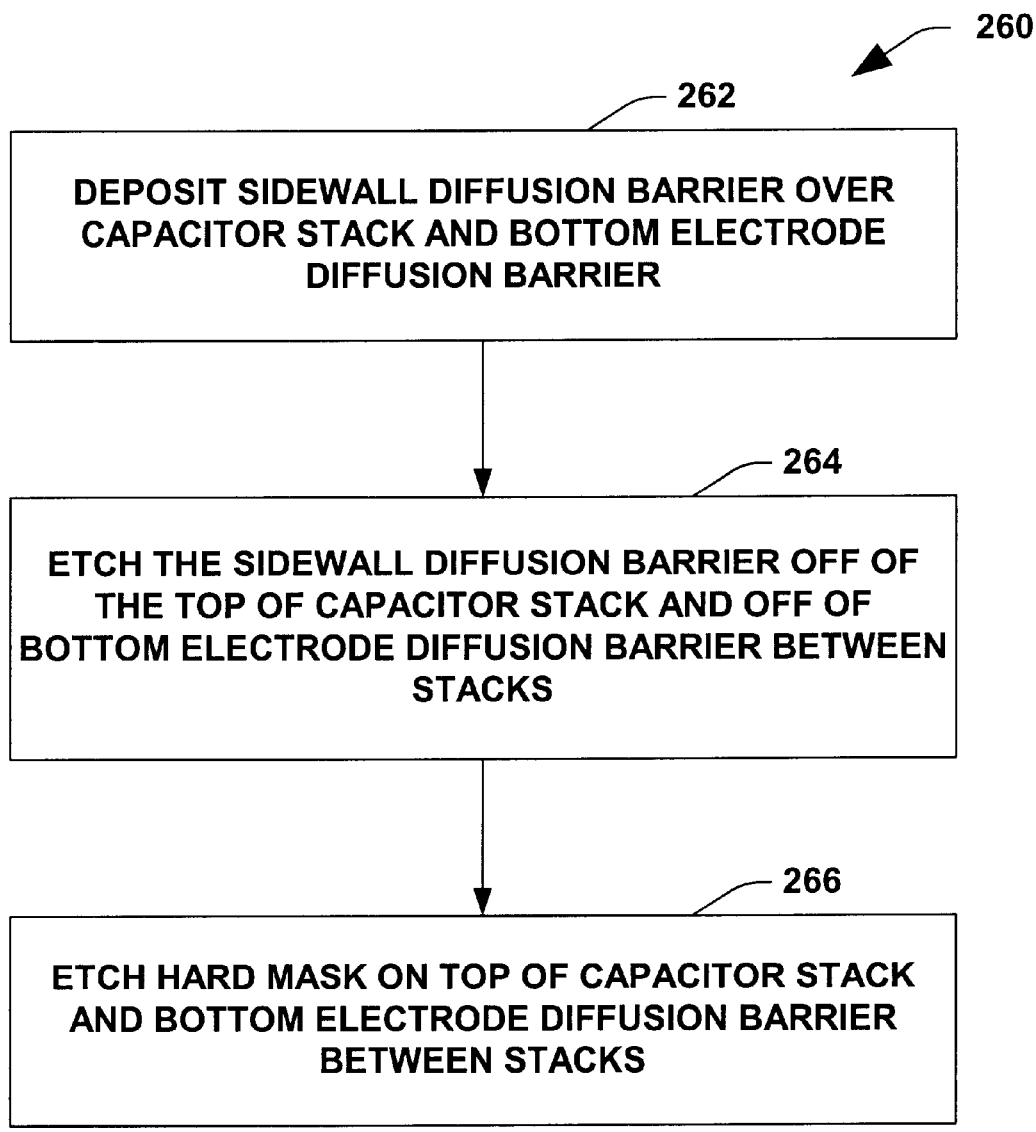
FIG. 17 is a flow chart diagram illustrating a method of forming an FeRAM capacitor wherein a sidewall diffusion barrier layer is deposited and selectively patterned prior to the patterning of the bottom electrode diffusion barrier layer according to the present invention.
Figure 18:
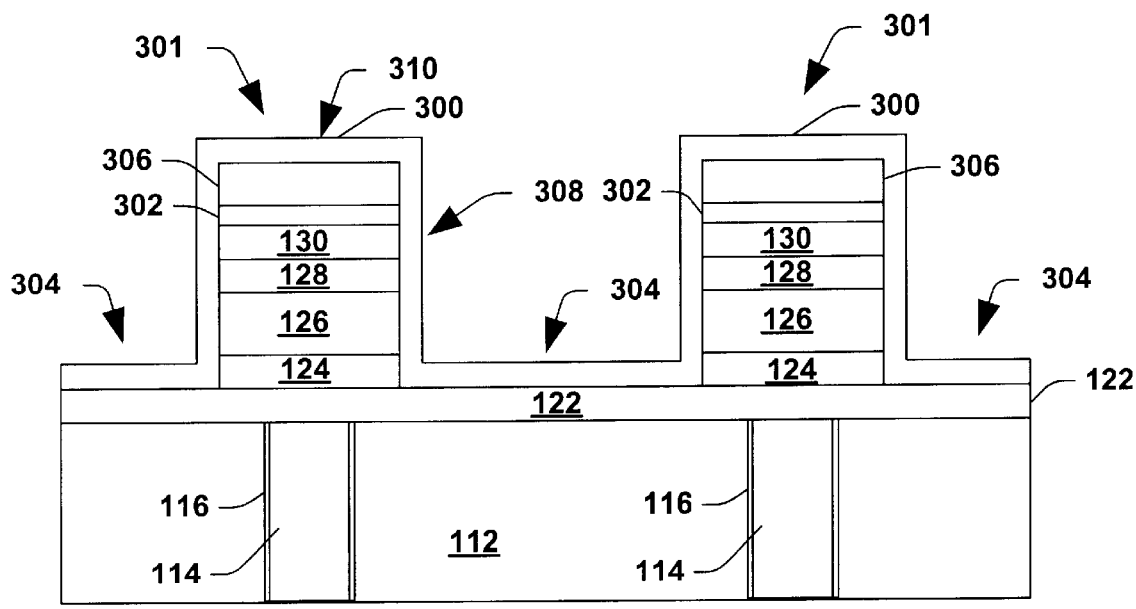
FIGS. 18 and 19 are fragmentary cross section diagrams illustrating steps in depositing and selectively patterning a sidewall diffusion barrier layer prior to patterning a bottom electrode diffusion barrier layer according to the present invention.

Turning to FIG. 17, a method 260 of forming the sidewall diffusion barrier layer in accordance with one aspect of the invention is provided. At 262, a sidewall diffusion barrier layer 300, for example, AlOx is formed over the capacitor stack 301 and the exposed portion 304 of the bottom electrode diffusion barrier layer 122, as illustrated in FIG. 18. In one example, the sidewall diffusion barrier 300 comprises AlOx having a thickness of about 8 nm or more and about 120 nm or less. More preferably, the AlOx barrier layer 300 has a thickness of about 10 nm or more and about 20 nm or less. Alternatively, other materials such as $Ta_2O_5$, AlN, $TiO_2$, $ZrO_2$, $HfO_2$, or any stack or combination thereof may be employed and are contemplated as falling within the scope of the present invention.

In one exemplary aspect of the present invention, the sidewall barrier 300 comprises a multi-layer with two possible materials, the first material being AlOx or one of the materials highlighted above, and the second layer comprising SiN or AlN. The sidewall diffusion barrier 300 primarily needs to prevent reaction between the PZT ferroelectric layer 126 and the interlayer dielectric (ILD) 112, 134. Another use as envisioned here is as part of the hydrogen diffusion barrier. It is currently planned to have complete protection of the capacitor to hydrogen during subsequent processing by the use of hydrogen diffusion barriers on all sides. For example, the TiAlN or TiAlON used as part of the hard mask 302, 306 and as the bottom electrode diffusion barrier 122 are conductive hydrogen barriers (since the capacitor will need to make electrical contact to and from the top/bottom electrodes) while the AlOx is an insulating hydrogen diffusion barrier (in order to prevent the top and bottom electrodes from shorting out the capacitor). For the exemplary process described herein, the AlOx is used as a Pb and H diffusion barrier while the $Si_3N_4$ that is deposited later on in the flow is used as a contact etch stop. In the subsequent text, AlOx will be used, however, it should be understood that other sidewall diffusion barrier materials may instead be used.

The primary reason for deposition at this point (prior to etching the bottom electrode diffusion barrier) is to make the AlOx etch process more simple. Other alternatives include, for example: AlOx etch back after PZT deposition which is helpful for physical bottom electrode etch processes, AlOx etch back after etching bottom electrode diffusion barrier which has advantages in limiting CD growth of this layer, but is a harder etch to develop, and no AlOx etch back but instead the AlOx is etched as the last part of the via etch process. In the subsequent discussions it is also assumed that a via etch stop layer (typically SiN but might possibly be SiC, for example) will be deposited prior to the deposition of interlayer dielectric.

Figure 19:
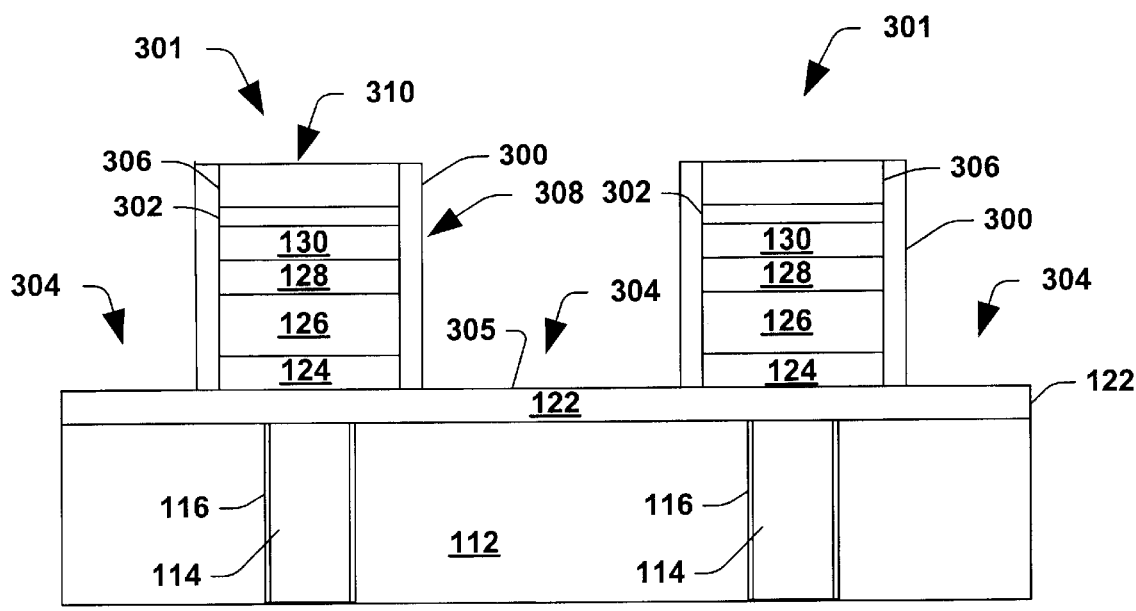

In accordance with one exemplary aspect of the present invention, a process for depositing the AlOx sidewall diffusion barrier layer is chemical vapor deposition (CVD) (e.g., MOCVD, CVD or atomic layer deposition), but other approaches such as sputter deposition can also be used. The primary advantage of the CVD approaches is better step coverage along the sidewalls 308 of the capacitor stack 302, which is desirable to ensure an effective sidewall barrier 300. Since what is important is the thickness after etch back of the AlOx on the sides 308 of the capacitor, a better step coverage dramatically reduces the planar thickness on top 310 of the capacitor stack and over the exposed portion 304 of the bottom electrode diffusion barrier layer 122 that needs to be deposited and etched. PVD deposition of the sidewall diffusion barrier 300 will work and one such exemplary deposition process is deposition using a pure Al target in an $Ar+O_2$ gas using a pulsed DC or an RF power supply.
Etching the Sidewall Barrier and Bottom Electrode Diffusion Barrier Returning to FIG. 17, the sidewall diffusion barrier 300 residing on the top 310 of the capacitor stack 301 and over the exposed portions 304 of the bottom electrode diffusion barrier 122 (between neighboring stacks) is etched at 264, as illustrated in FIG. 19. The AlOx etch back process needs to remove the AlOx from planar surfaces 305, 310, but not from the sidewalls 308 of the capacitors. It is therefore important to minimize the overetch of the AlOx, yet it is still necessary that the AlOx clears over the diffusion barrier layer 122 between neighboring capacitor stacks in order for a complete subsequent etching of the bottom electrode diffusion barrier layer 122, in order to prevent neighboring capacitors from shorting out each other (since the bottom electrode diffusion barrier layer is electrically conductive).

A conformal AlOx deposition process makes this much easier to achieve especially for a high aspect ratio ((>1) capacitor height to capacitor-to-capacitor space). According to one exemplary aspect of the present invention, the etch chemistry for etching the AlOx sidewall diffusion barrier is $BCl_3$+Ar. The $BCl_3$ is effective in etching the AlOx with a good selectivity to the underlying nitride hard mask 306 on top 310 of the capacitor stack (e.g., TiAlN) and nitride bottom electrode diffusion barrier 122 (e.g., TiAlON with small oxygen content) between 304 the neighboring capacitor stacks. The Ar may be added (as in the above example) to the etch chemistry because the resulting surface (of a top portion of the hard mask and the bottom electrode diffusion barrier) is smoother, but one disadvantage is that it etches AlOx on the sloped sides 308 of the capacitor; that is, the etch is less anisotropic. An exemplary etch process uses a high density plasma etch tool such as a AMAT DPS at near room temperature (~60° C.) with ~50% Ar at an intermediate gas pressure (~10 mTorr) 750W remote plasma power and low bias (e.g., 150W RF on chuck). The etch rate is 50 nm/min under this type of etch process.

This type of etch process would potentially cause problems if the etch back was performed after etching the TiAlN bottom electrode diffusion barrier because it quickly etches $SiO_2$ because this is also an oxide. However, in accordance with the present invention, since the AlOx sidewall diffusion barrier etch is performed prior to the etch of the bottom electrode diffusion barrier 122, no such problem occurs.

In addition, the $BCl_3$ etch is substantially selective with respect to the underlying nitride layers (the hard mask 306 and the bottom electrode diffusion barrier layers 122). The aluminum-oxygen bonds in the AlOx layer are extremely strong, however, the boron in the BCl$_3$ reacts with oxygen to break the aluminum-oxygen bonds. The chlorine in the BCl$_3$ then reacts with the aluminum to remove the AlOx. After the AlOx is removed, the boron in the BCl$_3$ reacts with nitrogen in the underlying nitrides to form boron nitride, which slows down subsequent etching. Therefore, one can perform a substantial overetch of the AlOx sidewall diffusion barrier layer without substantially impacting the nitrides underneath (e.g., TiAlN or TiAlON (low content O) masking layer 306 or bottom electrode diffusion barrier 122). This is particularly helpful with regard to the bottom electrode diffusion barrier layer 122 since it allows the AlOx to be completely removed thereover, thus ensuring that all of the underlying barrier 122 is exposed for removal in a subsequent etch process, and thus ensuring that the neighboring capacitor stacks 301 are electrically isolated from one another.

Figure 20:
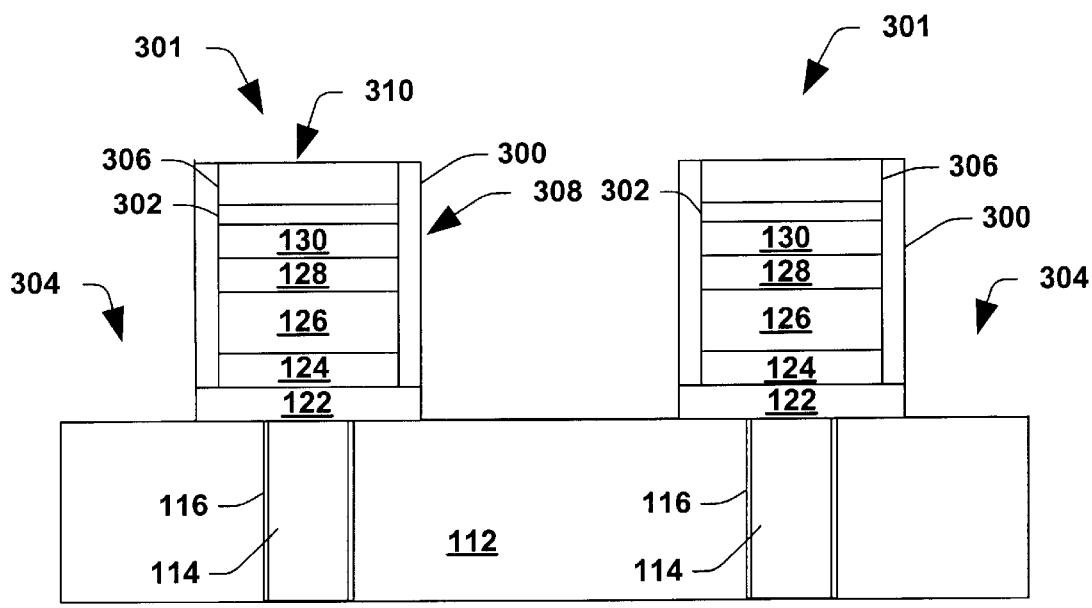
FIG. 20 is a fragmentary cross section diagram illustrating an etch of the bottom electrode diffusion barrier layer after the deposition and patterning of the sidewall diffusion barrier layer according to the present invention.

Using the same chamber the bottom electrode diffusion barrier is now etched at 266 of FIG. 17, as illustrated in FIG. 20. The chemistry, in one example, is changed to Cl$_2$+Ar which effectively etches TiAlN or TiAlON (low oxygen) (masking layer 306 and barrier 122), but has good etch selectivity to AlOx on the sidewalls 308 and to the TiAlON (high O) hard mask etch stop layer 302. The Ar etch gas component in one exemplary aspect of the present invention, is added to help achieve a smooth post etch surface although the disadvantage is an increase in the AlOx etch rate on the sidewalls of the capacitor stack(s). An example etch process uses a high density plasma etch tool such as a AMAT DPS at near room temperature (~60° C.) with ~50% Ar at an intermediate gas pressure (~10 mtorr) 1000W remote plasma power and low bias (e.g., 100W RF on chuck). The etch rate is 100 nm/min under this type of etch process.

It is common that the thickest part of the masking layer 306 is thicker than the bottom electrode diffusion barrier. Therefore the etch time and endpoint traces may be adjusted for this. This situation will therefore show up on the endpoint trace and also will result in reasonably large overetch on the W/TiN and SiO$_2$ under the capacitors. Fortunately the etch chemistry does not attack these materials very fast except for the TiN, and the Ar keeps this attack to a minimum because the TiN is only present as a thin diffusion barrier between the W contacts and SiO$_2$ dielectric. One problem that has been observed to occur during this etch was the undercut of the bottom electrode diffusion barrier 122 if it was TiAlN. By the addition of a small amount of oxygen during the TiAlN deposition process (as discussed surpa), the undercut of the TiAlON barrier 122 was for practical purposes eliminated. Another issue with this etch is that a reasonable amount of overetch is necessary in order to completely remove the TiAlN from above the hard mask etch stop layer 302. The TiAlN layer, when not completely removed, is very rough and will be difficult to make contact to during via formation because of SiN step coverage on the rough TiAlN.

Formation of Small Ears on Capacitor as Method to Prove Process Success

Figure 21:
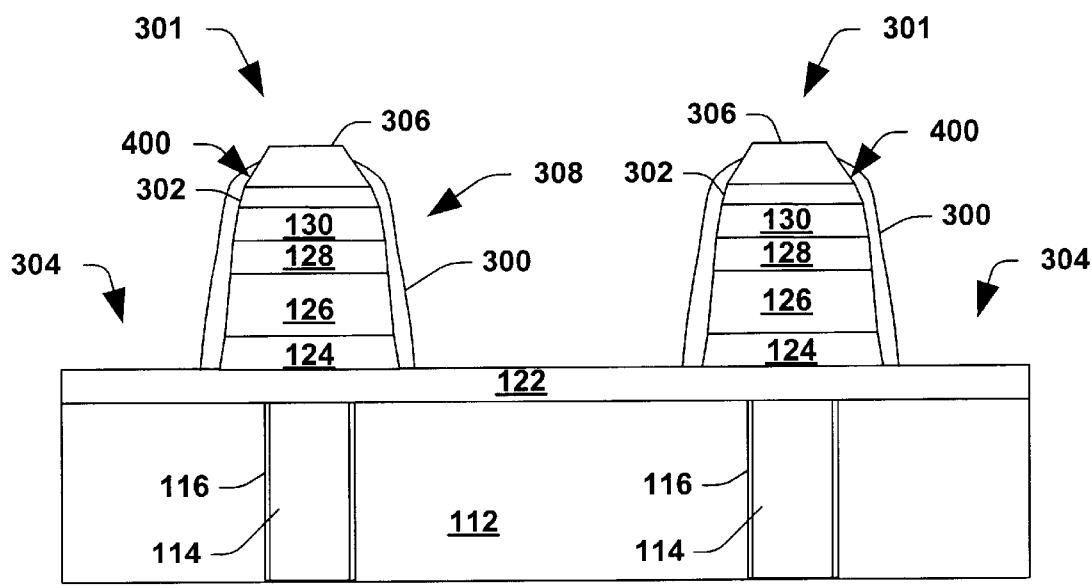
FIGS. 21 and 22 are fragmentary cross section diagrams illustrating how identification of aluminum oxide "ears" are employed to ascertain whether the sidewall diffusion barrier layer is sufficiently thick on sidewalls of FeRAM capacitors stacks according to the present invention.

In the discussion of the capacitor stack etch, the sidewall diffusion barrier etch and the bottom electrode diffusion barrier etch above, the accompanying figures illustrate such etches as ideally anisotropic, resulting in generally vertical sidewall profiles. Such sidewall illustrations, however, do not occur in typical processing, but are provided for ease of illustration and to illustrate other features of the present invention with simplicity and clarity. Instead, the above etches are not ideally anisotropic, and the actual capacitor stack cross section does not exhibit perfectly vertical sidewalls, but rather exhibits generally sloped stack sidewalls, as illustrated in FIG. 21. In FIG. 21, the capacitor stack (hard mask 302, 306, top electrode layer 128, 130, ferroelectric dielectric layer 126, and bottom electrode layer 124) has been etched with the bottom electrode diffusion barrier layer 122 remaining and the patterned sidewall diffusion barrier 300 on the sidewalls 308 of the stack.

As discussed above, it is desirable to remove the sidewall diffusion barrier layer 300 off of the top 310 of the capacitor stack and in the areas 304 between the stacks, however, it is desirable for the sidewall diffusion barrier 300 to remain on the stack sidewalls 308 in order to protect the ferroelectric dielectric 126 in the stack from hydrogen contamination. Because the capacitor stack is not perfectly vertical and since the etch thereof has a chemical component, the sidewall diffusion barrier layer 300 on the sidewalls 308 does get etched to some degree, and often it is desirable to analyze the capacitor stack after the sidewall barrier etch to ensure that the barrier 300 still covers the capacitor stack sidewalls 308. Because the remaining sidewall layer 300 may be relatively thin (e.g., about 150–200 Angstroms), analyzing the sidewall layer 300 is difficult, for example, requiring an expensive and laborious TEM (transmission electron microscopy) analysis.

Figure 22:
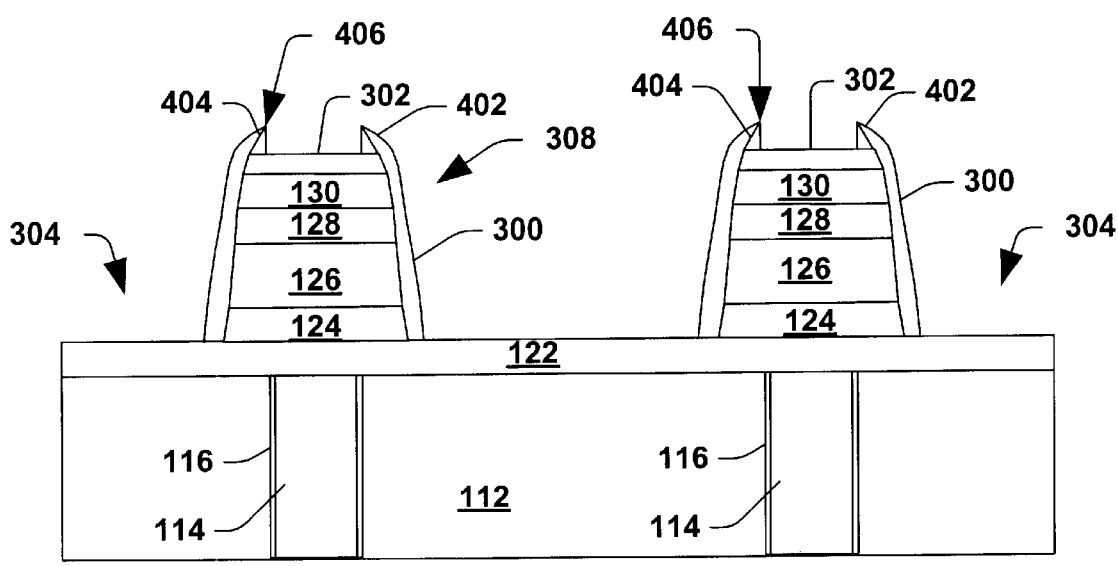

The inventors of the present invention discovered that if the thickness of the masking layer 306 is sufficiently thick, during the capacitor stack etch, although rounding will be experienced at the corners 400 thereof, the sidewall diffusion barrier layer 300 will overlie such corners 400 upon its deposition, as illustrated in FIG. 21. Subsequently, during the etch of the masking layer 306 portion of the hard mask (which will typically be done concurrently with an etch of the bottom electrode diffusion barrier layer 122), a portion 402 of the sidewall diffusion barrier layer 300 overlying a corner portion 404 of the masking layer 306 will protect such portion 404 of the masking layer 306 from being etched, thereby resulting in "ears" 406 being formed on top of the hard mask etch stop layer 302, as illustrated in FIG. 22. Note, however, if a thickness of the sidewall diffusion barrier layer 300 is not sufficiently thick, no portion 402 will overlie the masking layer 306, and consequently no "ears" will form.

Therefore by evaluating a capacitor stack after the etching of the masking layer 306, identification of the "ears" 404 will allow one to quickly ascertain that the sidewall diffusion layer 300 is adequately covering the capacitor stack sidewalls 308. The "ears" 406 are easy to detect (by a standard or tilt scanning electron microscope (SEM), for example), and their presence indicates that the sidewall barrier 300 (e.g., AlOx) is above the height of the hard mask etch stop diffusion barrier 302. A lack of "ears" 406, although not indicative of a lack of sidewall barrier coverage, does indicate that the sidewall barrier may not be sufficiently thick, and may warrant further analysis or a process change.

Therefore the thicknesses of the hard mask, AlOx deposition and etch back process and bottom electrode diffusion barrier etch back process are all adjusted to ensure that ears are observed because this easy to detect feature proves that AlOx protection is successfully in place.

Therefore in accordance with one aspect of the present invention, a method of ascertaining whether a sidewall diffusion barrier is sufficiently thick after patterning thereof is disclosed.

Complete Hydrogen Barrier Protection and Other Integration Possibilities

It is necessary to protect the ferroelectric material from hydrogen used by the rest of the semiconductor process. Many of the standard semiconductor processing steps contain hydrogen, for example, SiN deposition, HDP $SiO_2$ deposition using silane, CVD W deposition, forming gas anneal plus many others. Another problem is that only a few materials are hydrogen barriers, for example, $SiO_2$ is not. Hydrogen barrier materials include many nitrides such as TiN, TiAlN, AlN and SiN and AlOx. Ferroelectric electrode materials such as Ir or Pt are not effective barriers. Pt in particular is known to catalyze reaction of $H_2$ to H which appears to be much worse for ferroelectric properties.

Therefore in order to have complete hydrogen protection it is necessary to have complete protection from hydrogen (top, bottom and sides). In this disclosure the TiAlN or TiAlON is used as a hydrogen barrier on the top and bottom while AlOx is used on the sides of the capacitor. Complete protection requires not having any small gaps or seams between the various layers. Additional protection comes from the SiN except that the SiN deposition step frequently contains hydrogen so a hydrogen barrier is typically needed before this process as well.

Although the AlOx etch back is the primary approach of this disclosure there are other alternatives that also achieves these goals. The alternative approach the TiAlON bottom electrode diffusion barrier is etched immediately after etching the bottom electrode. This etch can either be performed at high T or low T although it is preferred that this be done at low T (<200° C.). The preferred etch chemistry for this utilizes a short $BCl_3$ containing (may contain Ar and/or $Cl_2$ as well) etch step followed by $Cl_2$+Ar etch as described previously. After post stack etch clean the AlOx followed immediately by deposition of the interlayer dielectric which may or may not include separate etch stop layer (typically SiN or SiC). One possibility is that the AlOx can be used as an etch stop by appropriate changes in the via etch chemistry.

The last step of the via etch is now etching AlOx. The preferred etch chemistry for this process is still $BCl_3$+Ar and it is desirable to minimize the amount of overetch that is needed. If a hydrogen diffusion barrier is next deposited in the via such as TaN or TiN as is typical in standard semiconductor processing then it might be possible to simplify the ferroelectric stack. By using this approach it is possible to remove the top and bottom electrode diffusion barrier or else to use materials that are not hydrogen barriers. The reason is that the hydrogen protection from the top comes from the AlOx plus the via barrier. These two layers also protect the capacitor from additional hydrogen from the bottom although it might be necessary to adjust the previous processes to prevent them from supplying hydrogen later on that without a bottom electrode hydrogen barrier degrade the capacitor properties.

Contamination Control/Backside Clean

It is recommended that after this etch step that the wafers be cleaned. Since no ferroelectric elements are deliberately exposed at this point, the primary purpose of this wet clean is to remove halogens (Cl) left on the surface from the etch which otherwise might cause corrosion problems and also to remove any particles left on the surface. The suggested chemistry for this process is therefore a DI $H_2O$ or a dilute SC1 type of chemistry. For particle removal the use of a megasonic or other such tool can also be used to promote particle removal.

At the beginning of the AlOx deposition process the front side of the wafer has exposed FeRAM elements. The AlOx deposition process may or may not result in contamination of the tool (defined to be addition of FeRAM contaminants on subsequent wafers at levels above care about level (~$10^{10}$ atoms/$cm^2$). If the AlOx deposition process on FeRAM wafers does not result in contamination then it is preferred to wet clean the backside of the wafer prior to depositing this sidewall diffusion barrier. If the AlOx deposition process on FeRAM wafers does result in tool contamination then instead of performing a backside wafer clean the clean after stack etch, the backside clean can be done after AlOx etch back/bottom electrode diffusion barrier etch step. One option is to anneal the capacitor at this point. One reason to do this anneal so soon is that if a low-K layer is chosen then it might not be compatible with the preferred PZT damage recovery anneal condition (600° C. 2 min).

Deposition of the Interlayer Dielectric Including Etch Stop

The preferred next step is the deposition of a via etch stop material. Example films are silicon nitride, silicon carbide, (SiCNO) or an silicon oxide (preferably a high-density plasma oxide). This etch stop layer is needed primarily because the via etch is reaching two different via depths. The etch stop makes simple means in order to etch two via depths without the large overetch on the thinner via causing a problem. The other advantage the etch stop has is that the SiN etch can be tuned to be selective to underlying materials (W, TiN and $SiO_2$). This prevents forming narrow grooves when a via is misaligned to the underlying contact. Forming these grooves is a particular reliability problem by making a thin spot in the via diffusion barrier especially for Cu vias. The etch stop thickness is chosen based on the via etch process.

Another advantage of having the etch stop is that it prevents misaligned vias that fall off the capacitor from shorting the capacitor. In a similar manner it allows vias placed close to the capacitor to be misaligned and still not short the capacitor. This behavior allows the FRAM bit cell size to be reduced by allowing a reduced via to capacitor space than if the etch stop was not present. The typical deposition process for the SiN would be PECVD using $SiH_4$ and $N_2$ or $NH_3$. It is preferred to use $SiH_4$ and $N_2$ in order to create a low H SiN barrier. If there is a worry that the AlOx sidewall protects all of the PZT, but not the electrode then it is recommended that a no hydrogen SiN process be used such as PECVD using $SiCl_4$ and $N_2$ or alternatively a very low T SiN process be used such as $SiH_4$ and $N_2$ using special low T PECVD such as ECR SiN. Another no hydrogen option is a PVD SiN barrier.

The preferred next layer is deposition of gap fill dielectric such as HDP $SiO_2$. With the SiN deposited the gaps between capacitor are very narrow and the aspect ratio is quite large. Therefore a gap fill dielectric is recommended. Another example of a gap fill dielectric is spin on glass. Although not desirable small voids between narrow capacitor space might be tolerated but voids where stacked vias for BL connection will be made will cause problems.

On top of this layer is the primary interlevel dielectric, as illustrated at 270 of FIG. 4, and possible material choices are $SiO_2$, FSG, PSG, BPSG, PETEOS, HDP oxide, a silicon nitride, silicon oxynitride, silicon carbide, silicon carbo-oxynitride , a low dielectric constant material (preferably SiLK, porous SiLK, teflon, low-K polymer (possibly porous), aerogel, xerogel, BLACK DIAMOND, HSQ, or any other porous glass material), or a combination or stack thereof.

After the deposition of the interlayer dielectric it is preferred to planarize the dielectric. The preferred method is chemical mechanical planarization (CMP) although other methods such as spin on dielectrics or deposition and etch back. CMP is preferred as it results in global and not just local planarization. The CMP planarization will thin the dielectric to a workable thickness above the capacitor. Preferred values are between 300 nm to 500 nm. The surface after CMP needs to be as planar as possible.

VIA0 Lithography and VIA0 Etch

Vias now need to be formed to make electrical connection to the top electrode and to contacts. Standard semiconductor processing techniques are used for this process. The via etch needs to etch through all of the dielectrics to the etch stop without etching through the etch stop because the vias have two different heights. Next the etch stop needs to be etched without etching a significant amount of the underlying material (W, TiN and $SiO_2$ at the contacts) and hard mask etch stop layer (TiAlON or TiON) on top of the capacitors under a few preferred embodiments. SiN etch processes with these characteristics have been developed and the etch selectivity to TiAlON has been documented to be very good. This result is useful since the SiN etch rate on the capacitor is expected to faster and the SiN is also expected to be thinner compared to at the contacts which is deeper.

Post Via Anneal

After the via etch, it is recommended that an anneal of the instant invention is performed, as illustrated at 280 of FIG. 4, so as to remove damage introduced by the capacitor stack processing (such as the ferroelectric material etch, encapsulation, and contact etch) into the capacitor dielectric and to improve the electrical properties of these features. If this anneal is not done at this point (i.e. if the anneal is done with the PZT stack exposed on its sidewalls), then it may result in the loss of Pb near the perimeter of each capacitor. This loss in Pb in the PZT film will result in the degradation of the electrical properties of small capacitors (capacitors with large perimeter to area ratios) after the capacitor integration.

The anneal of the instant invention is, preferably, performed after the interlevel dielectric is formed and the via holes patterned and etch, but prior to the filling of the vias with the conductive material. The anneal conditions, for example, are: around 400 to 800° C. (more preferably around 500 to 700° C.—most preferably around 600° C.) for a duration of around 30 seconds to 5 minutes (more preferably for around 1 to 4 minutes—most preferably around 2 minutes) in an inert gas ($N_2$, Ar) atmosphere or vacuum. After this anneal is performed, the via diffusion barrier (liner) and conductor are formed using standard semiconductor processing techniques. The conductor is either W with TiN diffusion barrier or more preferably Cu with TaN, TaSiN, Ta, TiN, WN, or TiSiN diffusion barrier deposited by enhanced sputter deposition or more preferably CVD. The Cu is deposited by first depositing a Cu seed by enhanced sputter deposition or CVD preferably followed by Cu electroplating in order to fill the via. A standard semiconductor processing approach after the deposition of the metal in the via is to remove the metal on the top surface by etch back (W) or CMP (W and Cu).

Another alternative is that metal layer above the via is formed using dual damascene process along with the via. The disadvantage of this approach is substantial increase in process complexity.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of performing a post capacitor stack etch clean for a ferroelectric memory cell, comprising:
   forming a bottom electrode layer, a PZT ferroelectric layer, and a top electrode layer over a substrate;
   etching the top electrode layer, the PZT ferroelectric layer, and the bottom electrode layer to form a capacitor stack, wherein the PZT ferroelectric layer has damage associated therewith due to the etching of the PZT ferroelectric layer;
   annealing the etched capacitor stack in a chamber having a lead source and oxygen, wherein a vapor pressure of the lead source is greater than a vapor pressure of the etched PZT ferroelectric layer, thereby facilitating a vapor transport of lead from the lead source to the etched PZT ferroelectric layer for repair thereof.

2. The method of claim 1, wherein annealing the etched capacitor stack comprises maintaining a temperature in the chamber in a range of about 450° C. or more and about 650° C. or less.

3. The method of claim 2, wherein the temperature in the chamber comprises 600° C.

4. The method of claim 1, wherein the lead source and oxygen comprise a PbO, $PbTiO_3$ or PZT source material.

5. The method of claim 1, wherein the chamber is a chemical vapor deposition chamber or a furnace chamber, and wherein the source material comprises a Pb metalorganic precursor, and wherein the Pb metalorganic precursor reacts with the oxygen to form PbO having a deposition rate which is less than its evaporation rate, thereby ensuring vapor transport and not deposition.

6. A method of performing a post capacitor stack etch treatment for a ferroelectric memory device, comprising:
   forming a bottom electrode diffusion barrier layer over a substrate;
   forming a bottom electrode layer, a PZT ferroelectric layer, and a top electrode layer in succession over the bottom electrode diffusion barrier layer;
   patterning a portion of the top electrode layer, the PZT ferroelectric layer and the bottom electrode layer in succession to form a capacitor stack overlying the bottom electrode diffusion barrier layer;
   repairing damage to the PZT ferroelectric layer due to the patterning of the capacitor stack, wherein the repairing comprises introducing lead into the PZT ferroelectric layer after the patterning thereof; and
   patterning a portion of the bottom electrode diffusion barrier layer which does not underlie the capacitor stack.

7. The method of claim 6, wherein repairing the damage to the PZT ferroelectric layer comprises annealing the capacitor stack in a chamber having a lead source and oxygen.

8. The method of claim 7, wherein repairing the damage to the PZT ferroelectric layer further comprises maintaining a vapor pressure of the lead source is greater than a vapor pressure of the patterned PZT ferroelectric layer.

9. The method of claim 7, wherein the lead source and oxygen comprise a PbO, PbTiO$_3$ or PZT source material.

10. The method of claim 7, wherein annealing the etched capacitor stack comprises maintaining a temperature in the chamber in a range of about 450° C. or more and about 650° C. or less.

11. The method of claim 10, wherein the temperature in the chamber comprises 600° C.

12. The method of claim 6, wherein repairing the PZT ferroelectric layer comprises:

placing the substrate in a chemical vapor deposition chamber or a furnace chamber; and subjecting the substrate to a source material which comprises a Pb metalorganic precursor, wherein the Pb metalorganic precursor reacts with the oxygen to form PbO having a deposition rate which is less than its evaporation rate, thereby ensuring vapor transport and not deposition.

13. The method of claim 6, wherein the patterning of the bottom electrode diffusion barrier layer occurs after repairing the damage to the PZT ferroelectric layer.

14. A method of performing a post capacitor stack etch treatment for a ferroelectric memory device, comprising:

forming a bottom electrode diffusion barrier layer over a substrate;

forming a bottom electrode layer, a PZT ferroelectric layer, and a top electrode layer in succession over the bottom electrode diffusion barrier layer;

patterning a portion of the top electrode layer, the PZT ferroelectric layer and the bottom electrode layer in succession to form a capacitor stack overlying the bottom electrode diffusion barrier layer;

introducing lead into the patterned PZT ferroelectric layer; and patterning a portion of the bottom electrode diffusion barrier layer which does not underlie the capacitor stack after formation of the capacitor stack.

* * * * *